(12) United States Patent
Misaki

(10) Patent No.: US 9,268,128 B2
(45) Date of Patent: Feb. 23, 2016

(54) METHOD OF MANUFACTURING MIRROR DEVICE

(71) Applicant: SUMITOMO PRECISION PRODUCTS CO., LTD., Hyogo (JP)

(72) Inventor: Tokiko Misaki, Hyogo (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 0 days.

(21) Appl. No.: 14/430,078

(22) PCT Filed: Sep. 19, 2013

(86) PCT No.: PCT/JP2013/005533
§ 371 (c)(1),
(2) Date: Mar. 20, 2015

(87) PCT Pub. No.: WO2014/050035
PCT Pub. Date: Apr. 3, 2014

(65) Prior Publication Data
US 2015/0248007 A1     Sep. 3, 2015

(30) Foreign Application Priority Data

Sep. 28, 2012  (JP) .................................. 2012-217747

(51) Int. Cl.
| | | |
|---|---|---|
| G02B 26/10 | (2006.01) | |
| B29D 11/00 | (2006.01) | |
| G02B 26/08 | (2006.01) | |
| B81C 1/00 | (2006.01) | |

(52) U.S. Cl.
CPC .............. *G02B 26/0816* (2013.01); *B81C 1/00* (2013.01); *G02B 26/0858* (2013.01)

(58) Field of Classification Search
CPC ... G02B 26/0858; G02B 26/0816; B81C 1/00
See application file for complete search history.

(56) References Cited

U.S. PATENT DOCUMENTS

| | | |
|---|---|---|
| 2005/0094931 A1 | 5/2005 | Yokoyama et al. |
| 2009/0225384 A1 | 9/2009 | Eiji et al. |

FOREIGN PATENT DOCUMENTS

| | | |
|---|---|---|
| JP | 2009-154264 A | 7/2009 |
| JP | 2009-222900 A | 10/2009 |
| JP | 2011-227216 A | 11/2011 |
| WO | WO 03/062899 A1 | 7/2003 |

OTHER PUBLICATIONS

International Search Report for corresponding International Application No. PCT/JP2013/005533 dated Nov. 5, 2013.
PCT/ISA/237 for corresponding International Application No. PCT/JP2013/005533 dated Nov. 5, 2013.

*Primary Examiner* — Nadine Norton
*Assistant Examiner* — Mahmoud Dahimene
(74) *Attorney, Agent, or Firm* — Renner, Otto, Boisselle & Sklar, LLP

(57) ABSTRACT

A portion of an SiO₂ layer 240 on a peripheral portion 255 of an actuator body portion 251 is left on the surface of the actuator body portion 251 when it is etched so as to extend over the outside of the piezoelectric element 4. When the third resist mask 330 covering the actuator body portion 251 and the mirror portion 252 is formed and etching is performed, the third resist mask 330 has a first slit 331 and a second slit 332, the second slit 332 exposing a peripheral portion 256 of a mirror portion 252, and the first slits 331 exposing a peripheral portion 256 of the actuator body portion 251 and a portion of the SiO₂ layer 240 on the actuator body portion 251, and having a width wider than the second slit 332.

6 Claims, 15 Drawing Sheets

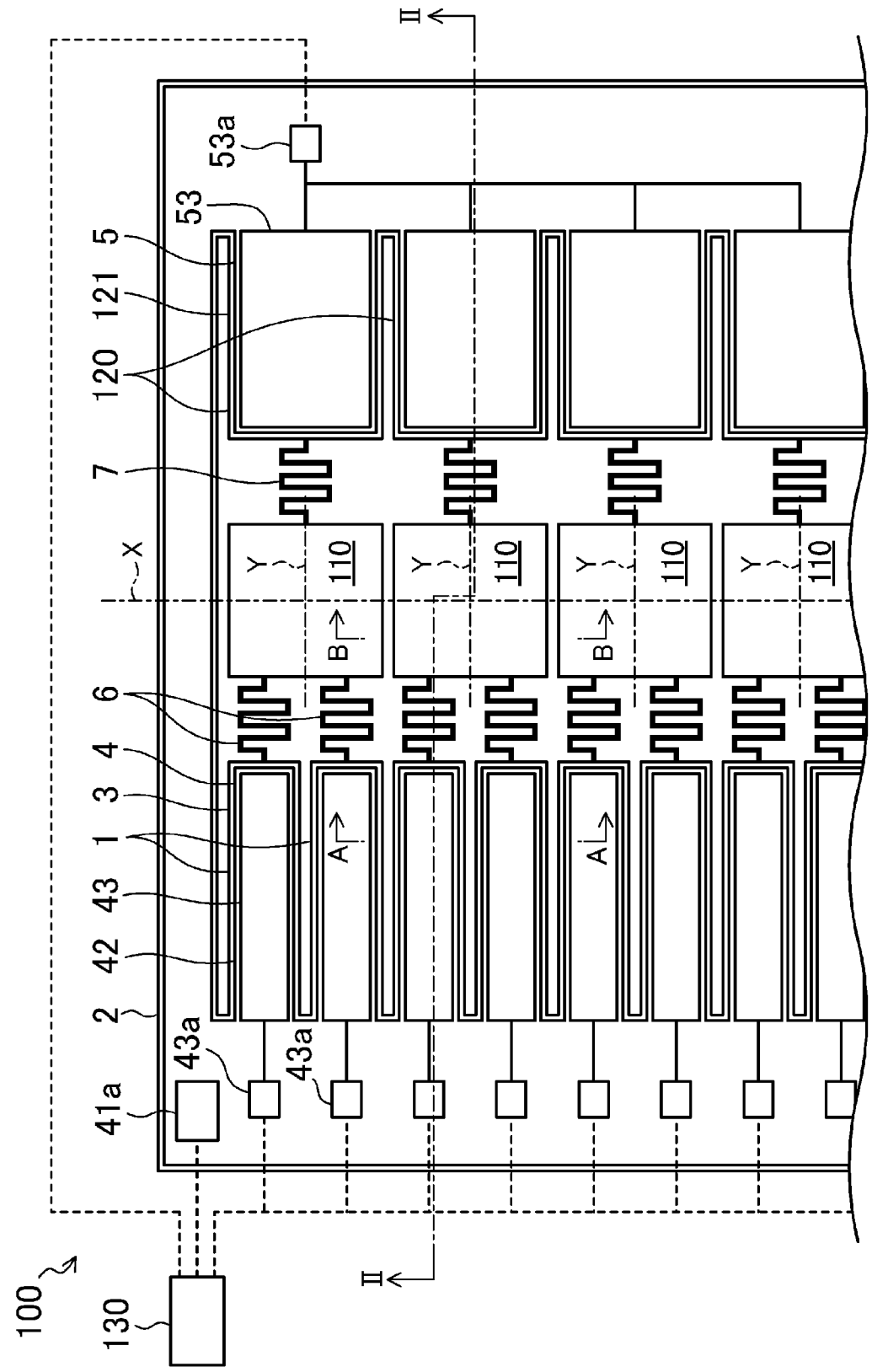

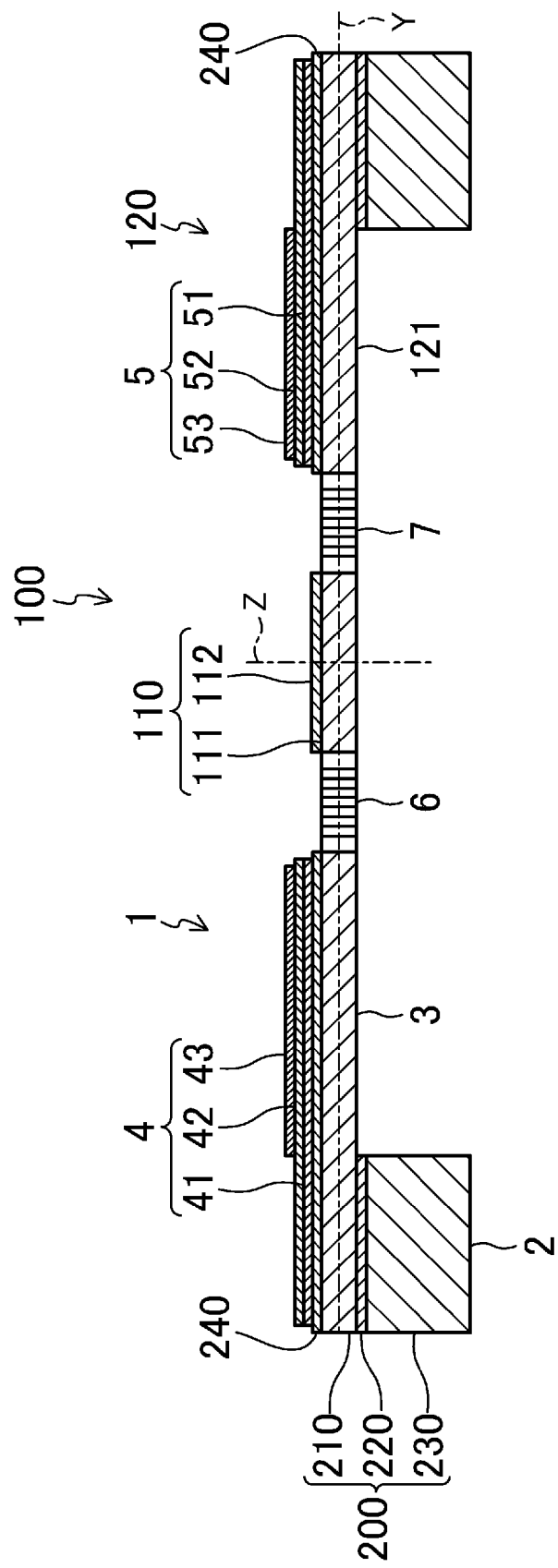

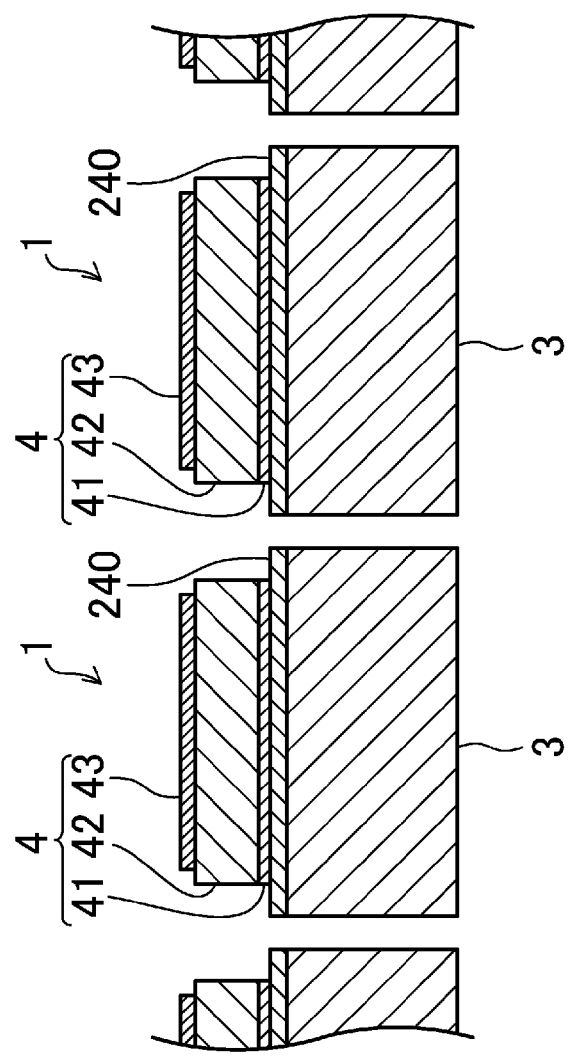
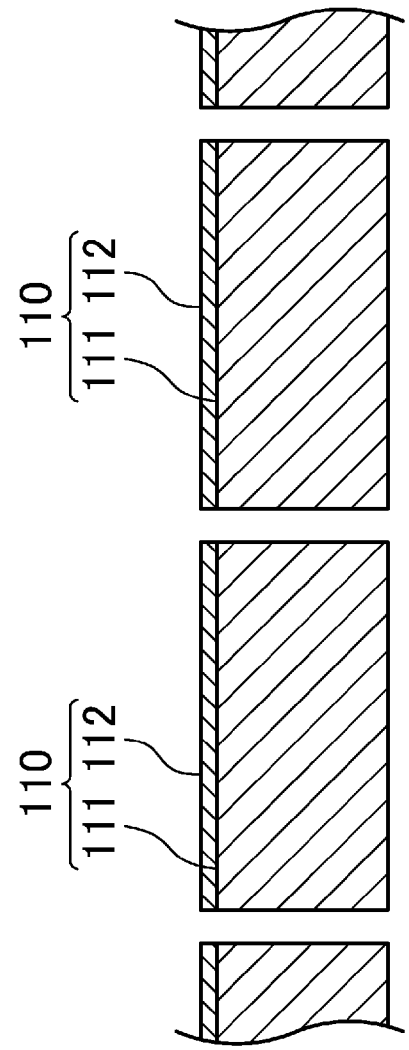
FIG.3A
FIG.3B

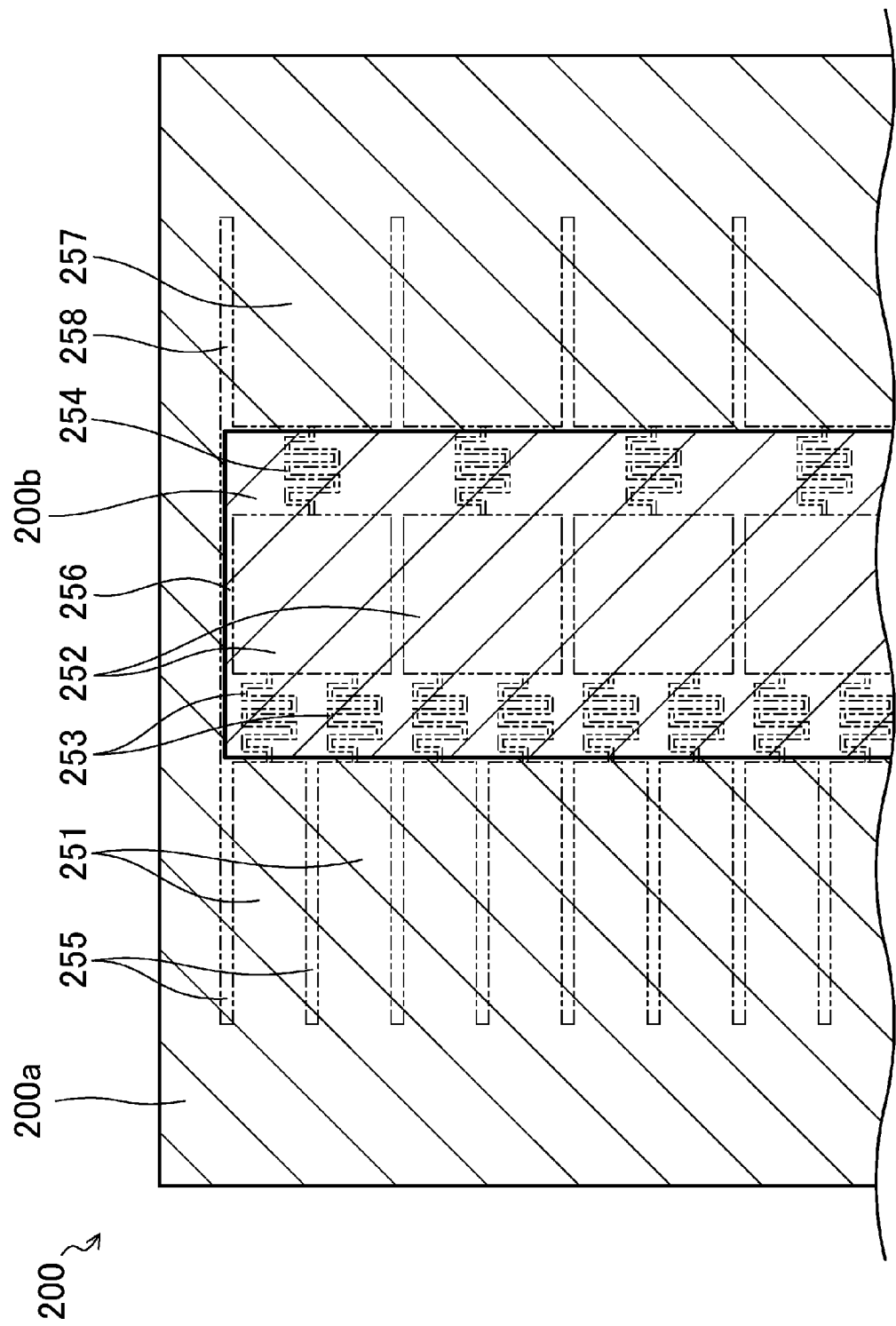

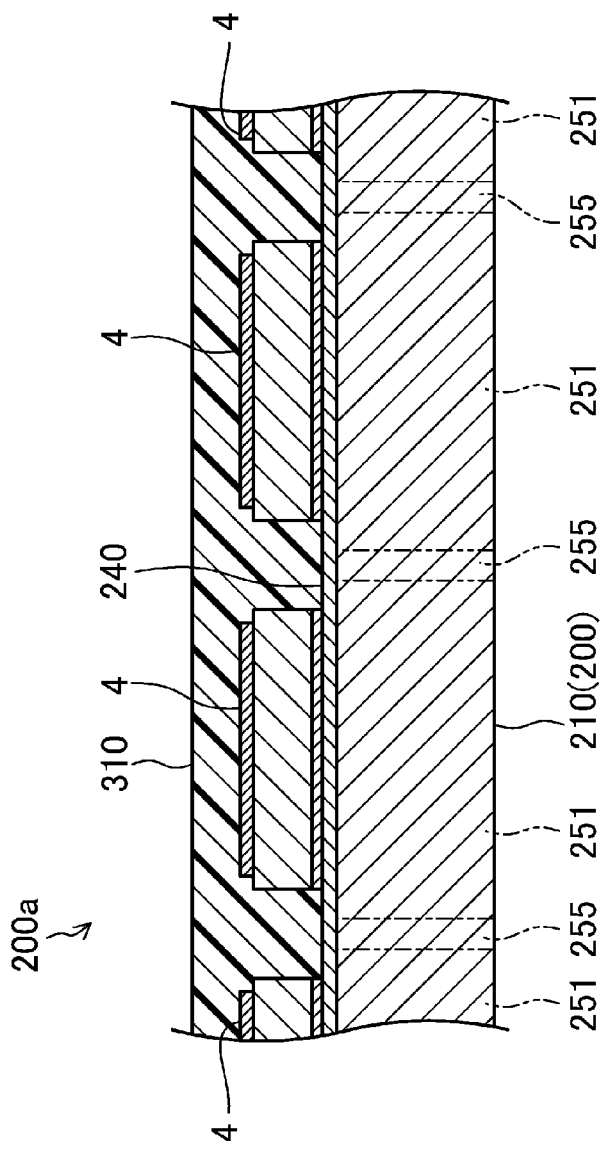
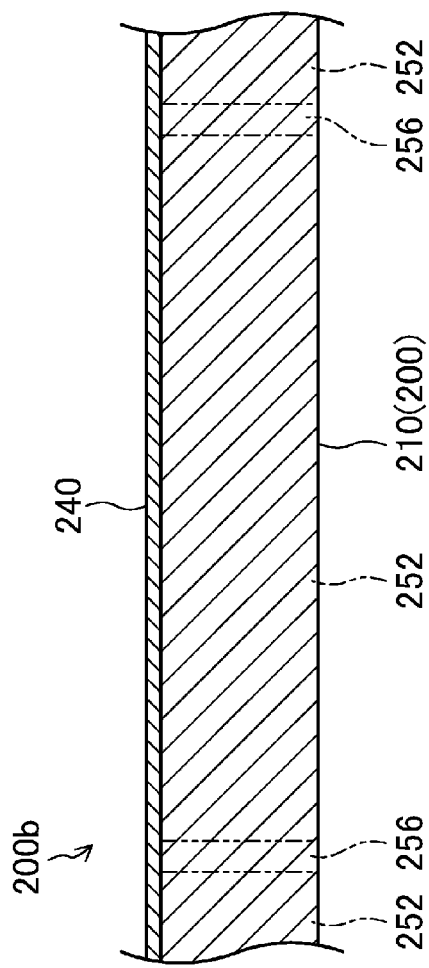
FIG.7A
FIG.7B

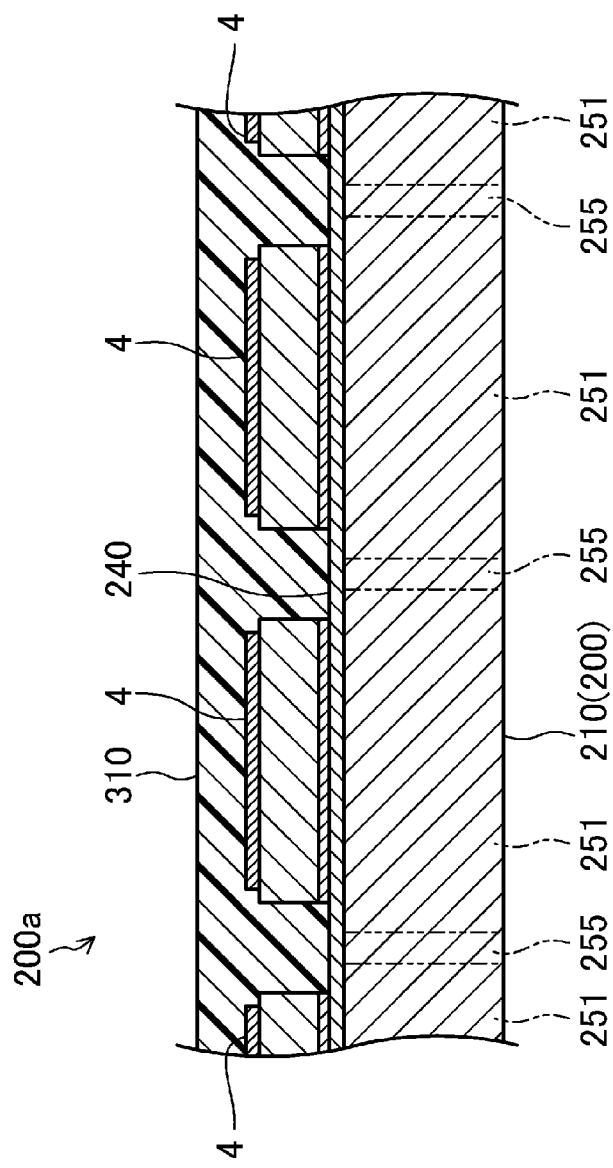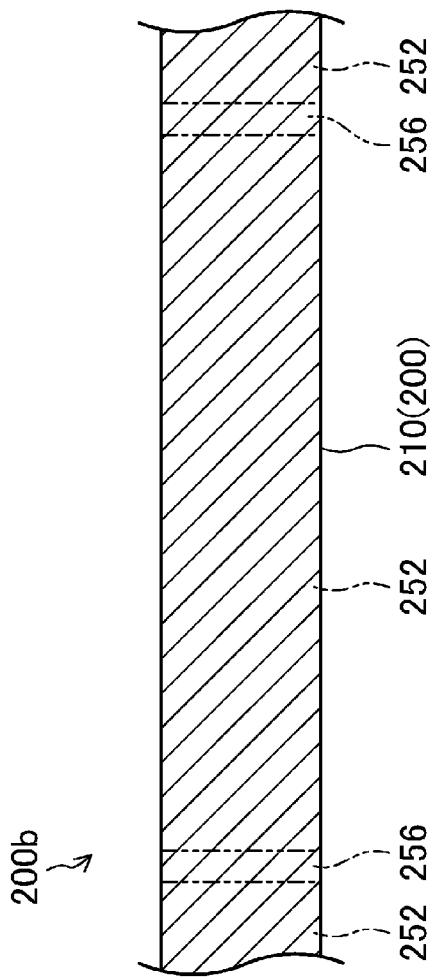
FIG.8A
FIG.8B

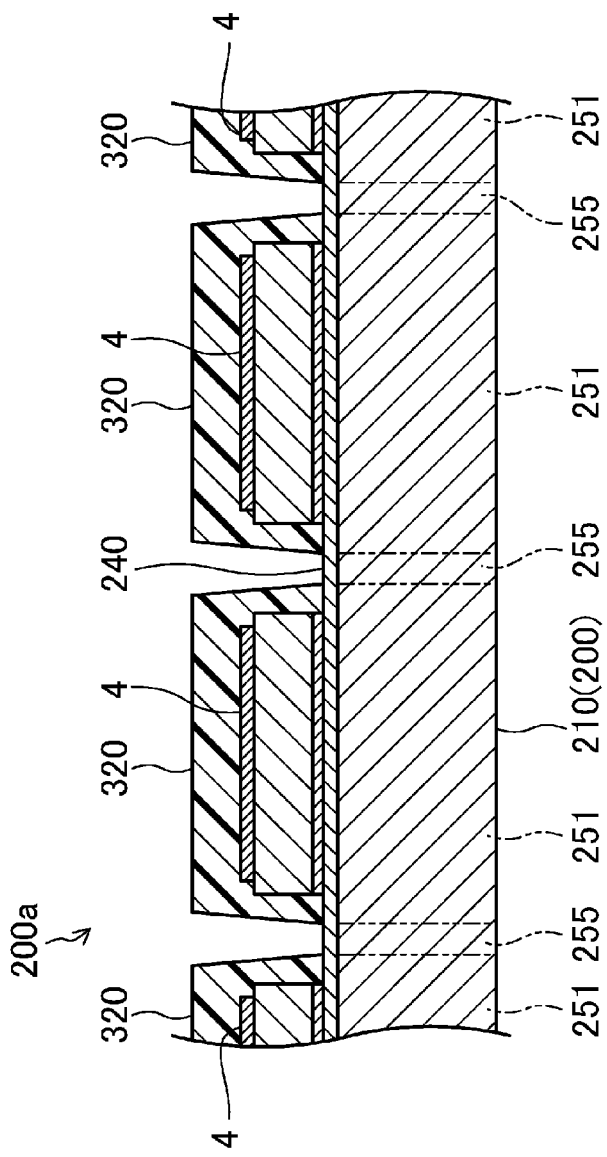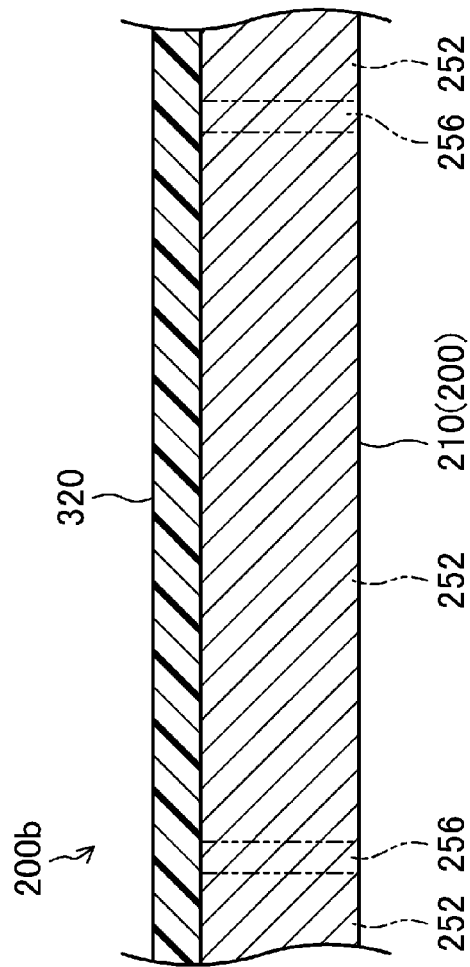
FIG.9A
FIG.9B

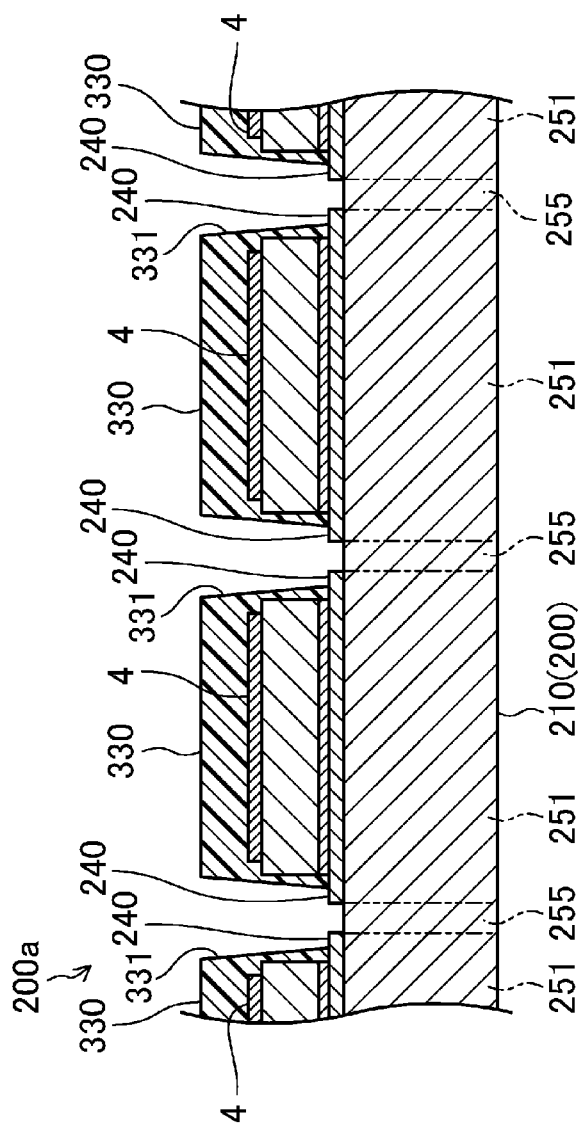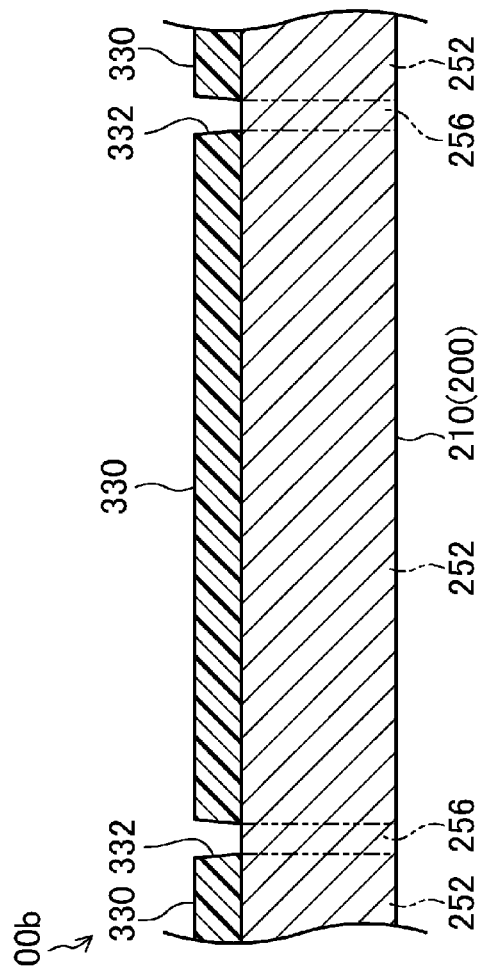

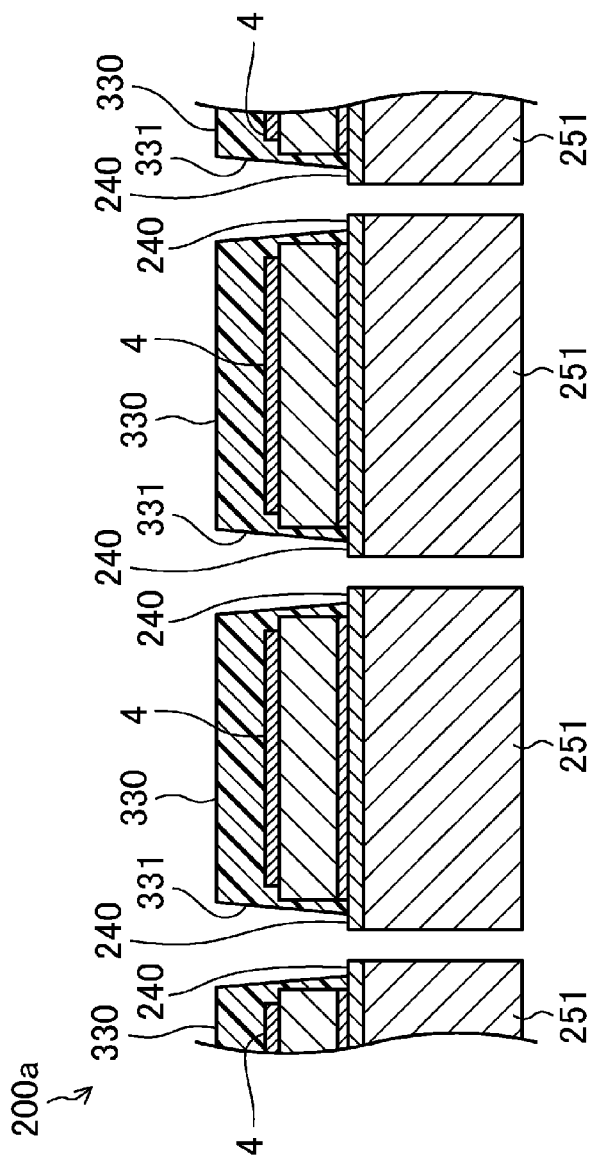
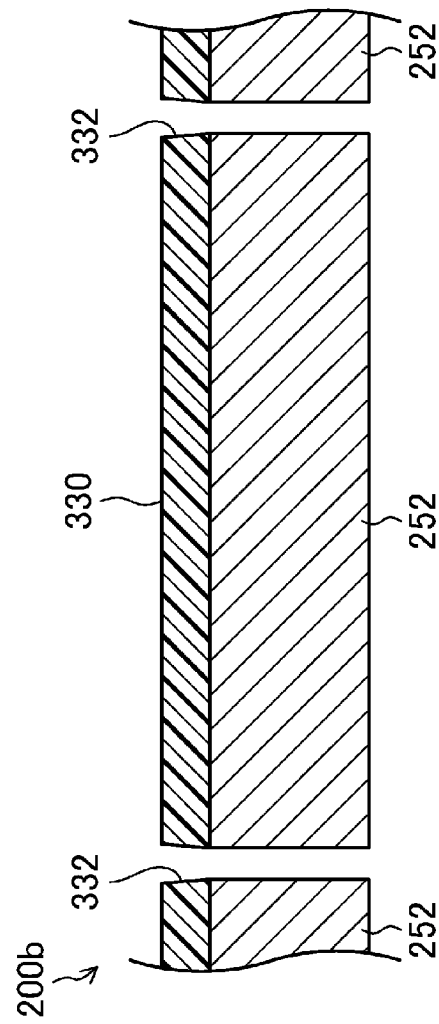
FIG.12A
FIG.12B

METHOD OF MANUFACTURING MIRROR DEVICE

TECHNICAL FIELD

A technique disclosed herein relates to methods of manufacturing mirror devices.

BACKGROUND ART

Conventionally, mirror devices in which mirrors are inclined by an actuator have been known. For example, Patent Document 1 discloses such a mirror device. An actuator in the mirror device is piezo-actuated, and has an actuator body and a piezoelectric element formed on the actuator body.

Such a mirror device is formed by, e.g., formation of a layer on a substrate such as a silicon on insulator (SOI) substrate, or etching of the substrate. For example, Patent Document 1 shows a method of manufacturing a mirror device, the method including forming an insulation layer (for example, an oxide layer) on an SOI substrate, and stacking, on the insulation layer, a lower electrode layer, a piezoelectric layer, and an upper electrode layer which constitute a piezoelectric element. Subsequently, a mask having a predetermined shape is formed and etching is performed, thereby forming the upper electrode layer and the piezoelectric layer into the shape for the piezoelectric element. Then, a portion that will be an actuator body (hereinafter referred to as "a portion to be the actuator body") including the piezoelectric element, and a portion that will be a mirror (hereinafter referred to as "a portion to be the mirror") are covered with a resist mask, and the peripheral portion of the portion that will be the actuator body and the peripheral portion of the portion that will be the mirror are removed by etching. In this way, the actuator body and the mirror are formed.

CITATION LIST

Patent Document

PATENT DOCUMENT 1: Japanese Unexamined Patent Publication No. 2011-227216

SUMMARY OF THE INVENTION

Technical Problem

In order to form a resist mask, a resist is applied to a substrate, etc., and exposure and development are performed. In the above-described piezo-actuated mirror device, since the piezoelectric element is formed on the portion to be the actuator body, the height of a portion of the resist on the portion to be the actuator body when measured from the substrate is higher than that of a portion of the resist on the portion to be the mirror by the height of the piezoelectric element. If a resist includes a portion having a higher height and a portion having a lower height from the substrate, it becomes difficult to set conditions of photolithography. That is, in the thicker portion of the resist, the resist does not completely dissolve unless, e.g., larger exposure energy, longer exposure time, longer development time, and part of the resist unnecessarily remains. In contrast, in the thinner portion of the resist, if the conditions of photolithography are too strong, the resist excessively dissolves. That is, if the resist includes the portion having a higher height and the portion having a lower height from the substrate, it becomes difficult to form a resist mask having a desired shape. In particular, if a slit is formed in a resist mask, such a problem becomes serious. If a resist mask cannot be formed so as to have a desired shape, it is impossible to precisely form the portion to be the actuator body and the portion to be the mirror.

The technique disclosed herein has been developed in view of the above problems, and is intended to precisely form both of a portion forming an actuator body and a portion forming a mirror in a substrate.

SOLUTION TO THE PROBLEM

The techniques disclosed herein are directed to a method of manufacturing a mirror device which includes at least one mirror and an actuator including at least one actuator body on which a piezoelectric element is formed, the actuator being configured to actuate the at least one mirror includes: preparing a substrate on which an insulation layer is formed, the piezoelectric element being formed on a portion of the insulation layer located on at least one portion to be the actuator body; first removing a portion of the insulation layer located in a second region including at least one portion to be the mirror by etching while leaving the insulation layer located in a first region of the substrate including the at least one portion to be the actuator body; second removing at least a portion of the insulation layer located on a peripheral portion of the portion to be the actuator body in the first region of the substrate by etching; and third removing the peripheral portion of the portion to be the actuator body and a peripheral portion of the portion to be the mirror of the substrate by etching after forming a resist mask covering the at least one portion to be the actuator body and the at least one portion to be the mirror of the substrate, wherein in the second removing, the insulation layer on a surface of the portion to be the actuator body is left so as to expand from the piezoelectric element, and the resist mask in the third removing includes a first slit and a second slit, the second slit exposing the peripheral portion of the portion to be the mirror of the substrate, and the first slit exposing the peripheral portion of the portion to be the actuator body of the substrate and the portion of the insulation layer located on the portion to be the actuator body, and having a width wider than the second slit.

According to the above configuration, the height of a portion of the resist mask on the portion to be the actuator body, measured from the substrate, is higher than that of a portion of the resist on the portion to be the mirror by the thickness of the piezoelectric element. Therefore, the first slit of the resist mask exposing the peripheral portion of the portion to be the actuator body has a depth deeper than the second slit exposing the peripheral portion of the portion to be the mirror. The first slit cannot be formed so as to pass through the resist mask if the conditions of photolithography are too weak while the second slit cannot be precisely formed if the conditions of photolithography are too strong, resulting in difficulty in achieving both of the above formations.

In contrast, according to the above configuration, the first slit has a width wider than the second slit. This can form the first slit such that the first slit passes through the resist mask even if the conditions of photolithography are not too strong, e.g., even if they are set to be suitable for the second slit. Since the conditions of photolithography do not have to be strong, the second slit can also be precisely formed.

Having a wider width in the slit leads to an increase in a region that will be etched in the subsequent etching. That is, the first slit exposes, in addition to the peripheral portion of the portion to be the actuator body of the substrate, a part of the portion to be the actuator body. However, the insulation layer is provided on the part of the portion to be the actuator body exposed from the first slit. Since the insulation layer serves as a resist mask, etching of the exposed part is reduced. Therefore, only the peripheral portion of the portion to be the actuator body can be precisely etched. At that time, since the second slit is precisely formed, only the peripheral portion of the portion to be the mirror can be precisely etched.

ADVANTAGES OF THE INVENTION

According to the method of manufacturing the mirror device, the resist mask can be precisely formed, and as a result, it is possible to precisely form the portion to be the actuator body and the portion to be the mirror of the substrate.

BRIEF DESCRIPTION OF THE DRAWINGS

FIG. 1 is a plan view of a mirror device according to a first embodiment.

FIG. 2 is a cross-sectional view taken along the line II-II of FIG. 1.

FIGS. 3A and 3B are cross-sectional views of the mirror device, with FIG. 3A being a cross-sectional view taken along the line A-A of FIG. 1 and FIG. 3B being a cross-sectional view taken along the line B-B of FIG. 1.

FIG. 6 is a plan view of the SOI substrate.

FIGS. 7A and 7B are cross-sectional views of the SOI substrate in a first masking process, with FIG. 7A being a cross-sectional view corresponding to the cross-section taken along the line A-A of FIG. 1, and FIG. 7B being a cross-sectional view corresponding to the cross-section taken along the line B-B of FIG. 1.

FIGS. 8A and 8B are cross-sectional views of the SOI substrate in a first etching process, with FIG. 8A being a cross-sectional view corresponding to the cross-section taken along the line A-A of FIG. 1, and FIG. 8B being a cross-sectional view corresponding to the cross-section taken along the line B-B of FIG. 1.

FIGS. 9A and 9B are cross-sectional views of the SOI substrate in a second masking process, with FIG. 9A being a cross-sectional view corresponding to the cross-section taken along the line A-A of FIG. 1, and FIG. 9B being a cross-sectional view corresponding to the cross-section taken along the line B-B of FIG. 1.

FIGS. 11A and 11B are cross-sectional views of the SOI substrate in a third masking process, with FIG. 11A being a cross-sectional view corresponding to the cross-section taken along the line A-A of FIG. 1, and FIG. 11B being a cross-sectional view corresponding to the cross-section taken along the line B-B of FIG. 1.

FIGS. 12A and 12B are cross-sectional views of the SOI substrate in a third etching process, with FIG. 12A being a cross-sectional view corresponding to the cross-section taken along the line A-A of FIG. 1, and FIG. 12B being a cross-sectional view corresponding to the cross-section taken along the line B-B of FIG. 1.

DESCRIPTION OF EMBODIMENTS

Figure 4:
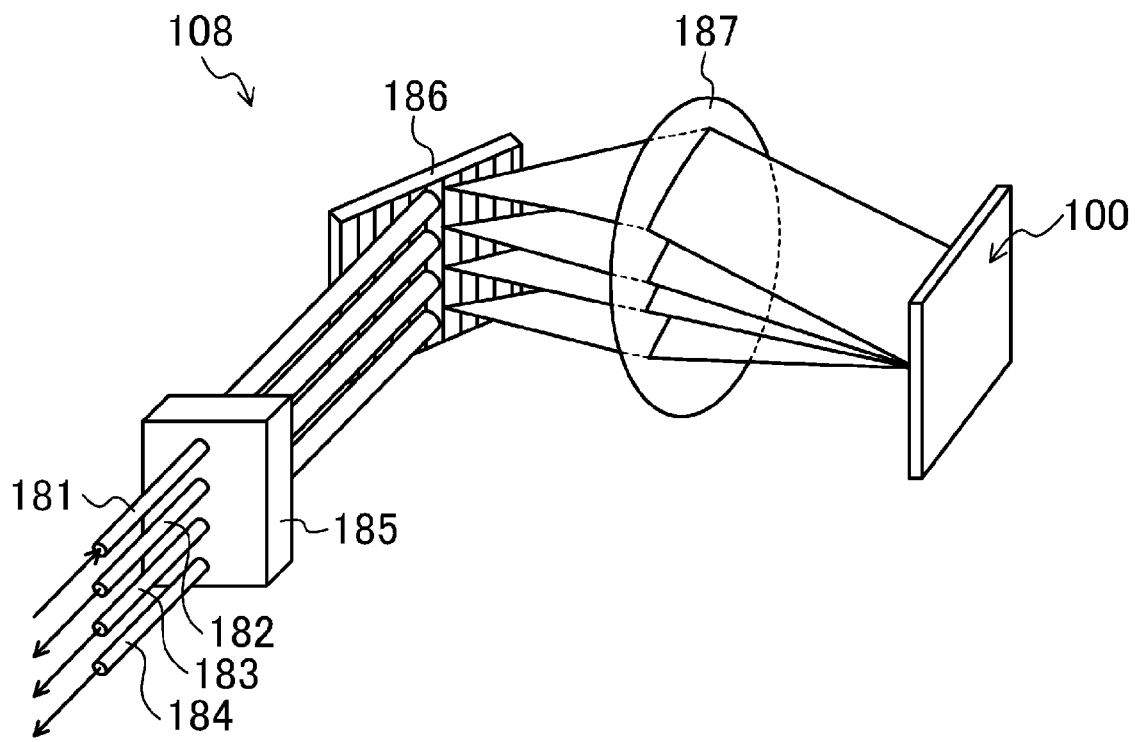
FIG. 4 is a schematic view of a wavelength selection switch.

Example embodiments will be described below with reference to drawings.

First Embodiment

Configuration of Mirror Device

FIG. 1 is a plan view of a mirror device 100. FIG. 2 is a cross-sectional view taken along the line II-II of FIG. 1. FIG. 3A is a cross-sectional view taken along the line A-A of FIG. 1, and FIG. 3B is a cross-sectional view taken along the line B-B of FIG. 1. FIG. 2 illustrates a piezoelectric layer 42 such that the piezoelectric layer 42 has a thinner thickness to simplify the figure.

The mirror device 100 includes a base 2 having a frame shape, 200 actuators 1, 1, ..., 100 mirrors 110, 110, ..., 100 beam members 120, 120, ..., first hinges 6 each coupling each of the actuators 1 to a corresponding one of the mirrors 110, second hinges 7 each coupling each of the mirrors 110 to a corresponding one of the beam members 120, and a controller 130 controlling the actuator 1, 1, ... One of the mirrors 110 and two of the actuators 1, 1, and one of the beam members 120 constitute one set of a mirror unit. Thus, each of the mirrors 110 is supported by two actuators 1, 1, and one beam member 120, and is actuated by the two actuators 1, 1. As a result, the mirror 110 rotates about a main axis-X and an auxiliary-axis Y which are orthogonal to each other.

The mirror device 100 is manufactured using a silicon on insulator (SOI) substrate 200, as illustrated in FIG. 2. The SOI substrate 200 is formed by sequentially stacking a first silicon layer 210 made of monocrystalline silicon, an oxide layer 220 made of $SiO_2$, and a second silicon layer 230 made of monocrystalline silicon.

The base 2 is formed to have a substantially rectangular frame shape. Most part of the base 2 is formed by the first silicon layer 210, the oxide layer 220, and the second silicon layer 230.

The mirror 110 is formed to have a substantially rectangular plate shape. The mirror 110 includes a mirror body 111 formed by the first silicon layer 210, and a mirror surface layer 112 formed on the surface of the mirror body 111. The 100 mirrors 110, 110, ... are aligned in the main axis-X direction.

The first hinge 6 has one end coupled to the tip end of the actuator 1, and the other end coupled to an edge of the mirror 110. The first hinge 6 extends so as to meander between the tip end of the actuator 1 and one side of the mirror 110. This configuration can easily deform the first hinge 6. The mirror 110 is coupled to two of the first hinges 6, 6. That is, the mirror 110 is coupled to the two actuators 1, 1 through the two of the first hinges 6, 6. The two of the first hinges 6, 6 are coupled to portions of the one side of the mirror 110 so as to be symmetrically located about the middle point of the one side. The first hinge 6 is formed of the first silicon layer 210.

One end of the second hinge 7 is coupled to another side of the mirror 110 facing the side to which the first hinges 6 are coupled. The other end of the second hinge 7 is coupled to the beam member 120. The second hinge 7 extends so as to meander between the another side of the mirror 110 and the beam member 120. This configuration can easily deform the first hinge 7. The second hinge 7 coupled so as to be located in the middle point of the another side of the mirror 110. The second hinge 7 is formed of the first silicon layer 210.

Each of the actuators 1 includes the base 2, an actuator body 3 coupled to the base 2, and a piezoelectric element 4 formed on the surface of the actuator body 3. The 200 actuators 1, 1, . . . are aligned in a direction parallel to the main axis-X direction.

The actuator body 3 has a base end coupled to the base 2 to be supported to the base 2 in a cantilever fashion. The actuator body 3 is rectangular plate-shaped when viewed from the top, and extends in the auxiliary-axis Y direction. The tip end of the actuator body 3 is coupled to the first hinges 6. The actuator body 3 is formed of the first silicon layer 210. The actuator body 3 is integrally formed with a portion of the base 2 formed of the first silicon layer 210.

The piezoelectric element 4 is formed on the front surface of the actuator body 3 (the surface that is located in the same side of the surface on which the mirror surface layer 112 of the mirror 110 is formed). The piezoelectric element 4 includes a lower electrode 41, an upper electrode 43, and a piezoelectric layer 42 sandwitched therebetween. The lower electrode 41, the piezoelectric layer 42, and the upper electrode 43 are sequentially formed on the surface of the actuator body 3. The piezoelectric element 4 is formed of another member different from that of the SOI substrate 200. Specifically, the lower electrode 41 is made of a Pt/Ti layer. The piezoelectric layer 42 is made of lead zirconate titanate (PZT). The upper electrode 43 is made of an Au/Ti layer.

The piezoelectric layer 42 extends so as to overlap not only the actuator body 3 but also the surface of the base 2, and is integrally formed with a piezoelectric layer 52, described later, of a piezoelectric element 5 on the beam member 120. That is, the piezoelectric layers 42, 42, . . . of the actuators 1, 1, . . . and the piezoelectric layers 52, 52, . . . of the beam members 120, 120, . . . are coupled together.

The upper electrode 43 is formed in a region corresponding to the actuator body 3. The upper electrode 43 is electrically connected to an upper terminal 43a on a portion of the piezoelectric layer 42 provided on the base 2 through a trace pattern. One upper terminal 43a is provided to each upper electrode 43.

The lower electrode 41 has substantially the same shape as the piezoelectric layer 42. Thus, the lower electrode 41 extends so as to overlap not only the actuator body 3 but also the surface of the base 2, and integrally formed with the piezoelectric layer 52, described later, of the piezoelectric element 5 on the beam member 120. The lower electrode 41 is not exposed to the outside. The base 2 is provided with a lower terminal 41a electrically connected to the lower electrodes 41. All the lower electrodes 41, 41, . . . are connected to one lower terminal 41a.

The beam member 120 includes a beam body 121 coupled to the base 2, and the piezoelectric element 5 formed on the surface of the beam body 121. The 100 beam members 120, 120, . . . are aligned in a direction parallel to the main axis-X direction. The beam member 120, though including the piezoelectric element 5, supports the mirror 110 without actuating the mirror 110.

The beam member 120 is provided opposite to the actuators 1, 1 with the main axis-X therebetween. The beam body 121 has a base end coupled to the base 2 to be supported to the base 2 in a cantilever fashion. The beam body 121 is rectangular plate-shaped when viewed from the top, and extends in the auxiliary-axis Y direction. The tip end of the beam body 121 is coupled to the second hinge 7. The beam body 121 is formed of the first silicon layer 210. The beam body 121 is integrally formed with a portion of the base 2 formed of the first silicon layer 210.

The piezoelectric element 5 has a similar configuration to the piezoelectric element 4. That is, the piezoelectric element 5 includes a lower electrode 51, an upper electrode 53, and a piezoelectric layer 52 sandwiched therebetween. The piezoelectric element 5 is provided on the substantially entire surface of the beam body 121, and has a width wider than the piezoelectric element 4. The base 2 is provided with an upper terminal 53a electrically connected to the upper electrode 53. All the upper electrodes 53, 53, . . . are connected to one upper terminal 53a.

Operation of Mirror Device

Subsequently, the operation of the mirror device 100 having such a configuration will be described. The controller 130 applies a voltage to the upper terminal 43a, the upper terminal 53a, and the lower terminal 41a. According to the voltage, the piezoelectric layer 42 contracts or expands to curve the actuator body 3 upward or downward, and the piezoelectric layer 52 contracts or expands to curve the beam body 121 upward or downward.

More specifically, the controller applies an offset voltage to the lower electrode 41 and the upper electrode 43 of each of the actuators 1, and also applies an offset voltage to the lower electrode 51 and the upper electrode 53 of each of the beam members 120. This allows the actuator 1 to curve such that the piezoelectric element 4 faces inside the curvature, and allows the beam member 120 to curve such that the piezoelectric element 5 is internally located. The offset voltage applied to the actuator 1 and the offset voltage of the beam members 120 are set such that the tip end of the actuator 1 and the tip end of the beam member 120 have the same height (a position in a Z direction). That is, in a state where the offset voltages are applied to the actuator 1 and the beam member 120 (hereinafter referred to as "reference state"), the mirror 110 is located parallel to the XY plane. A voltage is applied to the piezoelectric element 5 of the beam member 120 to offset the beam member 120 and allow the beam member 120 to be in the reference state, and not to actuate the mirror 110.

From this state, the voltage applied to the lower electrode 41 and the upper electrode 43 of each of the actuators 1 is increased or decreased, thereby causing each of the actuators 1 to curve to rotate the mirror 110. Specifically, the increasing or decreasing both of the voltages applied to two of the actuators 1, 1 allows both of the two actuators 1, 1 to curve in the same direction, thereby being able to rotate the mirror 110 about the main axis-X. At this time, selecting one of increasing or decreasing both of the voltages applied to the two actuators 1, 1 can switch the rotation direction of the mirror 110 about the main axis-X. Increasing the voltage applied to one of the actuators 1 and decreasing the voltage applied to the other of the actuators 1 allows the two actuators 1, 1 to curve in the opposite directions to each other, thereby being able to rotate the mirror 110 about the auxiliary-axis Y. At this time, switching states of voltages, namely, the increasing and decreasing voltages, between the two actuators 1, 1 can switch the rotation direction of the mirror 110 about the auxiliary-axis Y.

The controller 130 can be an arithmetic unit such as a CPU. The controller 130 determines a voltage value of a drive voltage for rotating the mirror 110 at a desired rotation angle, with reference to parameters memorized in a memory unit accessible from the arithmetic unit. The parameters show a rotation angle of the mirror 110 for each drive voltage, and are memorized in the memory unit in the form of table data or in the form of coefficients of an approximate curve.

The mirror device 100 can be used while being incorporated in, e.g., a wavelength selection switch 108. FIG. 4 illustrates a schematic view of the wavelength selection switch 108.

The wavelength selection switch 108 includes one input optical fiber 181, three output optical fibers 182-184, a collimator 185 provided in the optical fibers 181-184, a spectroscope 186 having a diffraction lattice, a lens 187, and the mirror device 100. In this example, only the three output fibers are used, but the number thereof is not limited thereto.

The wavelength selection switch 108 receives a plurality of optical signals having wavelengths different from one another through the optical fiber 181. The collimator 185 collimates these optical signals. The spectroscope 186 splits the collimated optical signals into a predetermined number of optical signals having a specified wavelength. The splitted optical signals are collected by the lens 187 and enter the mirror device 100. The number of the splitted predetermined wavelengths correspond to the number of the mirrors 110 in the mirror device 100. That is, the splitted optical signals having a specified wavelength enters the corresponding mirrors 110. The optical signals are reflected by the respective mirrors 110, pass through the lens 187 again, and enter the spectroscope 186. The spectroscope 186 combines the plurality of optical signals having different wavelengths together to output the combined signal to the output optical fibers 182-184. The mirror device 100 rotates the respective mirrors 110 about the main axis-X to adjust reflection angles of the optical signals, and switches selection of the output optical fibers 182-184 to which the corresponding optical signal is input. Still specifically, in order to switch the selection of the output optical fibers 182-184 to which the optical signals are input, when the rotation angle of each of the mirrors 110 about the main axis-X is changed, the rotation angle of the mirror 110 about the main axis-X is changed once with the mirror 110 being rotated about the auxiliary-axis Y, and then, the rotation about the auxiliary-axis Y is returned to the original angle. This prevents the reflected light from the mirror 110 from being input to an undesired output optical fiber when the rotation angle about the main axis-X is changed.

Method of Manufacturing Mirror Device

Figure 5:
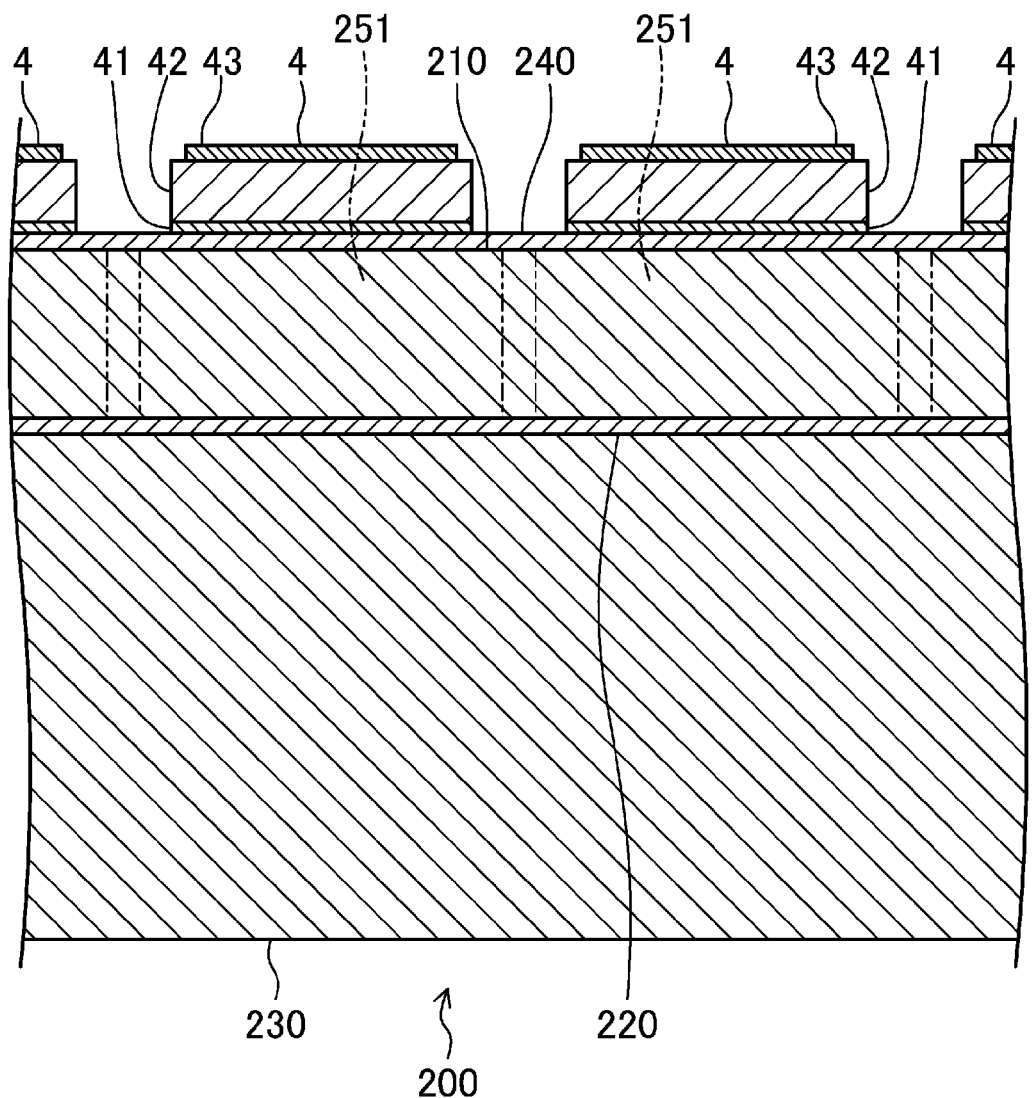
FIG. 5 is a cross-sectional view of an SOI substrate in which an $SiO_2$ layer is formed on the surface thereof, and a piezoelectric element is formed on the $SiO_2$ layer.

Subsequently, a method of manufacturing the mirror device 100 will be described. FIGS. 5-12B illustrate an SOI substrate 200 for describing processes of manufacturing the mirror device 100. FIG. 5 is a cross-sectional view of the SOI substrate 200 in which an SiO₂ layer 240 is formed on the surface thereof, and a piezoelectric element 4 is formed on the SiO₂ layer 240. FIG. 6 is a plan view of the SOI substrate 200. FIGS. 7A-12B are cross-sectional views of the SOI substrate 200 in the manufacturing processes, with FIGS. 7A, 8A, 9A, 10A, 11A, and 12A being cross-sectional views corresponding to the cross-section taken along the line A-A of FIG. 1, and FIGS. 7B, 8B, 9B, 10B, 11B, and 12B being cross-sectional views corresponding to the cross-section taken along the line B-B of FIG. 1. FIG. 7A-12B omit illustration of the oxide layer 220 and the second silicon layer 230 in the SOI substrate 200. Since the actuators 1 and the beam members 120 are manufactured in the same process, illustration of the beam members 120 will be omitted in the description below.

First, in a preparation process, a substrate is prepared on which an insulation layer is formed the piezoelectric element being formed on a portion of the insulation layer located on a portion to be the actuator body. The preparation process includes a substrate preparation process, a layer formation process, and a piezoelectric element formation process.

The substrate preparation process prepares the SOI substrate 200. The SOI substrate 200 is one example of the substrate.

Then, in the layer formation process, the SiO₂ layer 240, a Pt/Ti layer, a PZT layer, and an Au/Ti layer are sequentially formed on the surface of the first silicon layer 210 of the SOI substrate 200. Specifically, the SiO₂ layer 240 serving as an insulation layer is formed on the entire surface of the SOI substrate 200 by thermal oxidation. Then, the Pt/Ti layer, the PZT layer, and the Au/Ti layer are sequentially formed on the surface, on which the SiO₂ layer 240 is formed, of the first silicon layer 210 by sputtering. Before the Au/Ti layer is formed, a portion of the PZT layer where the lower terminal 41a of the lower electrode 41 is provided is removed by wet etching. With this wet etching, the Au/Ti layer is formed on the Pt/Ti layer in the removed portion, and both of the layers are electrically connected. The SiO₂ layer 240 is one example of the insulation layer.

In the piezoelectric element formation process, the Au/Ti layer, the PZT layer, and the Pt/Ti layer are sequentially etched to form the piezoelectric element 4, as illustrated in FIG. 5. Specifically, the Au/Ti layer is first dry-etched to form the upper terminal 43a, the upper terminal 53a, the lower terminal 41a, and the upper electrode 43. Next, the PZT layer and the Pt/Ti layer are dry-etched to form the piezoelectric layer 42 and the lower electrode 41.

In this way, as illustrated in FIG. 5, the piezoelectric element 4 is formed on the SiO₂ layer 240 located on the portion 251 of the SOI substrate 200 to will be the actuator body 3 (hereinafter referred to as "actuator body portion").

Next, in a first removal process, the SiO₂ layer 240 located in a second region 200b of the SOI substrate 200 is removed. Here, the SOI substrate 200 includes, as illustrated in FIG. 6, a first region 200a including the actuator body portion 251, and a portion 257 to be the beam body 121 (hereinafter referred to as "beam body portion"), and the second region 200b including a portion 252 to be the mirror 110 (hereinafter referred to as "mirror portion"), a portion 253 to be the first hinges 6 (hereinafter referred to as "the first hinge portion"), and a portion 254 to be the second hinge 7 (hereinafter referred to as "the second hinge portion"). The first region 200a also includes, in addition to the actuator body portion 251 and the beam body portion 257, a peripheral portion 255 of the actuator body portion 251, and a peripheral portion 258 of the beam body portion 257. The second region 200b also includes a peripheral portion 256 of these portions, in addition to the mirror portion 252, the first hinge portion 253, and the second hinge portion 254. The first removal process includes a first masking process, and a first etching process.

First, in the first masking process, as illustrated in FIG. 7, a first resist mask 310 for covering the first region 200a and exposing the second region 200b is formed. Specifically, a positive resist is coated on the surface of the SOI substrate 200 by spin-coating, and the resist is exposed and developed to form the first resist mask 310 having a predetermined pattern. The first resist mask 310 covers the first region 200a and exposes the second region 200b.

Then, in the first etching process, the portion of the SiO₂ layer 240 located in the second region 200b is removed by isotropic wet etching using HF. As a result, as illustrated in FIG. 8B, the portion of SiO₂ layer 240 located in the second region 200b is removed. As illustrated in FIG. 8A, the SiO₂ layer 240 remains in the first region 200a. Then, the first resist mask 310 is removed. Isotropic dry etching may be used.

Next, in a second removal process, in the first region 200a, a portion of the SiO₂ layer 240 located on the peripheral portion 255 of the actuator body portion 251 is removed. The second removal process includes a second masking process and a second etching process.

First, in the second masking process, a second resist mask 320 for covering the actuator body portion 251 of the first region 200a, and the entire surface of the second region 200b is formed. Specifically, the second resist mask 320 is a positive type, and as illustrated in FIG. 9A, in the first region 200a, covers the actuator body portion 251, and exposes the peripheral portion 255 of the actuator body portion 251, i.e., a portion between adjacent ones of the actuator body portions 251, 251. Since the piezoelectric element 4 is formed on the actuator body portion 251, the second resist mask 320 covers the piezoelectric element 4, too. At that time, the second resist mask 320 also fully covers side surfaces of the piezoelectric element 4, and a portion of the SiO$_2$ layer 240 located on the actuator body portion 251. The second resist mask 320, as illustrated in FIG. 9B, covers the entire surface of the second region 200b.

Figure 10A:
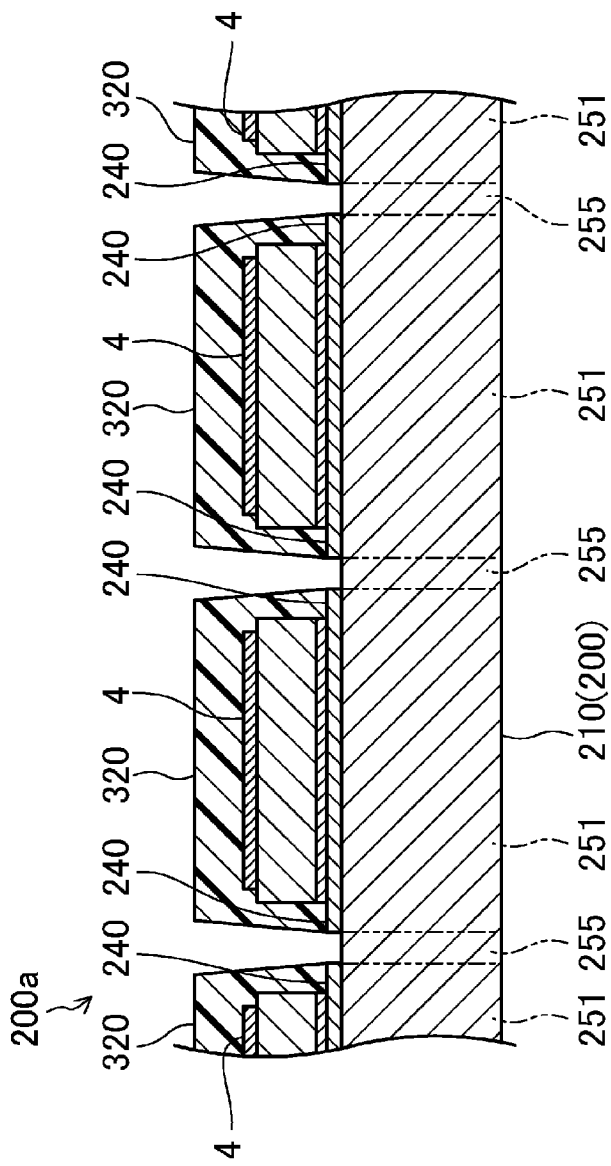
FIGS. 10A and 10B are cross-sectional views of the SOI substrate in a second etching process, with FIG. 10A being a cross-sectional view corresponding to the cross-section taken along the line A-A of FIG. 1, and FIG. 10B being a cross-sectional view corresponding to the cross-section taken along the line B-B of FIG. 1.
Figure 10B:
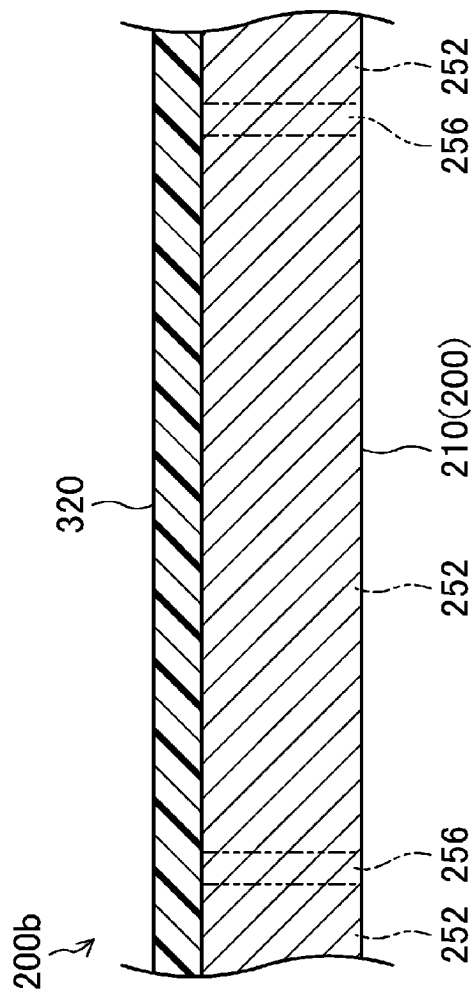

Then, in the second etching process, in the first region 200a, the portion of the SiO$_2$ layer 240 located on the peripheral portion 255 of the actuator body portion 251 is removed by anisotropic dry etching. As a result, as illustrated in FIG. 10(a), the portion of the SiO$_2$ layer 240 located on the peripheral portion 255 of the actuator body portion 251 is removed. The second resist mask 320 also covers the portion of the SiO$_2$ layer 240 located on the actuator body portion 251. Therefore, the portion of the SiO$_2$ layer 240 located on the actuator body portion 251 remains so as to expand from the piezoelectric element 4. Then, the second resist mask 320 is removed.

Next, in a third removal process, the first silicon layer 210 is etched to form the actuator body 3, the mirror 110, the first hinges 6, and the second hinges 7. The third removal process includes a third masking process and the third etching process.

First, in the third masking process, a third resist mask 330 for covering the actuator body portion 251, the mirror portion 252, the first hinge portion 253, and the second hinge portion 254 is formed. The third resist mask 330 is one example of the resist mask.

Specifically, a positive resist is coated on the surface of the SOI substrate 200 by spin-coating, and the resist is exposed and developed to form the third resist mask 330 having a predetermined pattern. In the first region 200a, the third resist mask 330 has first slits 331, 331, . . . for exposing the peripheral portion 255 of the actuator body portion 251 of the SOI substrate 200, as illustrated in FIG. 11A. In the first slit 331, a part of the portion of the SiO$_2$ layer 240 located on the actuator body portion 251 is also exposed. That is, the third resist mask 330 exposes an outer peripheral edge portion of the portion of the SiO$_2$ layer 240 located on the actuator body portion 251, and covers the rest (the piezoelectric element 4, and a portion of the SiO$_2$ layer 240 closer to the piezoelectric element 4). In contrast, in the second region 200b, the third resist mask 330 has second slits 332, 332 for exposing the peripheral portion 256 of the mirror portion 252, the peripheral portion 256 of the first hinge portion 253, and the peripheral portion 256 of the second hinge portion 254 of the SOI substrate 200, as illustrated in FIG. 11B. In FIG. 11B, the first hinge portion 253, the second hinge portion 254, and the peripheral portion 256 of these portions are not exposed. That is, the second slit 332 is formed so as to surround the mirror portion 252, the first hinge portion 253, or the second hinge portion 254 when viewed from the top. In the second region 200b, the third resist mask 330 fully covers the mirror portion 252, the first hinge portion 253, and the second hinge portion 254, and exposes only the peripheral portion 256.

Then, the third etching process removes the peripheral portion 255 of the actuator body portion 251, the peripheral portion 256 of the mirror portion 252, the peripheral portion 256 of the first hinge portion 253, and the peripheral portion 256 of the second hinge portion 254 in the first silicon layer by anisotropic dry etching. Here, silicon is selectively etched.

Specifically, in the first slits 331, in addition to the peripheral portion 255 of the actuator body portion 251, the portion of SiO$_2$ layer 240 located on the actuator body portion 251 is exposed. However, the exposed SiO$_2$ layer 240 is not much etched. In the second etching process, since the SiO$_2$ layer 240 remains on the entire surface of the actuator body portion 251, and does not exist on the peripheral portion 255, only the peripheral portion 255 is etched. That is, the SiO$_2$ layer 240 serves as a mask in etching the peripheral portion 255.

In contrast, in the second slit 332, the peripheral portion 256 of the mirror portion 252, etc., is exposed, and the peripheral portion 256 is etched.

As a result, as illustrated in FIG. 12, of the first silicon layer 210, the peripheral portion 255 of the actuator body portion 251, the peripheral portion 256 of the mirror portion 252, the peripheral portion 256 of the first hinge portion 253, and the peripheral portion 256 of the second hinge portion 254 are removed. Then, the third resist mask 330 is removed.

Then, a part of the second silicon layer 230 below back sides of the actuator body portion 251, the mirror portion 252, the first hinge portion 253, the second hinge portion 254, and the beam body portion 257 are removed by dry etching. Subsequently, a part of the oxide layer 220 on the back sides is removed by wet etching. In this way, the actuator bodies 3, 3, . . . , the mirror body 111, 111, . . . , the beam body 121, 121, . . . , the first hinges 6, 6, . . . , and the second hinges 7, 7, . . . are formed.

Furthermore, an Au/Ti layer is formed on the front surface of the mirror 110. The Au/Ti layer constitutes the mirror surface layer 112 of the mirror 110. The Au/Ti layer may be formed on the back surface of the mirror 110. In this case, the Au/Ti layer on the back surface serves as a balance weight.

In this way, the mirror device 100 is manufactured.

In the third masking process of the manufacturing method, as illustrated in FIG. 11, the height differs between a portion of the third resist mask 330 formed on the actuator body portion 251 and a portion of the third resist mask 330 formed on the mirror portion 252. Specifically, in the third masking process, since the resist is applied by a spin coater, the resist has a substantially uniform thickness. However, regarding the entire thickness of the resist, i.e., the height measured from the surface of the first silicon layer 210 to the surface of the resist, the thickness of the portion of the third resist mask 330 on the actuator body portion 251 is larger than that on the mirror portion 252 since the piezoelectric element 4 is formed on the actuator body portion 251. As a result, the first slit 331 has a depth deeper than the second slit 332. If a slit has a deeper depth, and, a resist may not completely dissolve, and the slit may not be formed so as to pass through the resist when the resist is exposed and developed. This poses a problem especially when the width of the slit is narrow. In order to encounter the problem, photolithography may be performed in strong conditions, such as larger exposure energy, longer exposure time, and longer development time. However, in such strong conditions, the third resist mask 330 on the mirror portion 252 having a smaller thickness excessively dissolves, and the second slit 332 may not be precisely formed.

In contrast, the first slit 331 has a width wider than the second slit 332. Here, the width of the slit means a width on the bottom of the slit. The wider width of the first slits 331 can make the first slit 331 pass through the third resist mask 330 without using the strong conditions of photolithography. Since the strong conditions of photolithography are not used, the second slit 332 can be precisely formed. Specifically, the width of the second slit 332 can substantially coincide with that of the peripheral portion 256 of the mirror portion 252.

If the width of the slit is unnecessarily wide, an undesired part may be etched. The first slit 331 is formed to have a wider width, and as a result, its width is wider than that of the peripheral portion 255 located in the first slit 331. As a result, the outer peripheral edge portion of the actuator body portion 251 is exposed in the first slit 331, and is exposed to etching species in the subsequent third etching process. However, the $SiO_2$ layer 240 is formed on the surface of the outer peripheral edge portion. The $SiO_2$ layer 240 protects a portion of the actuator body portion 251 exposed to the first slits 331 from being etched. That is, the $SiO_2$ layer 240 serves as a mask. As a result, though the first slits 331 has a width wider than the peripheral portion 255, etching of a portion except the peripheral portion 255 can be reduced.

In this way, the third resist mask 330 is precisely formed to be able to precisely form both of the actuator body portion 251 and the mirror portion 252.

Figure 13:
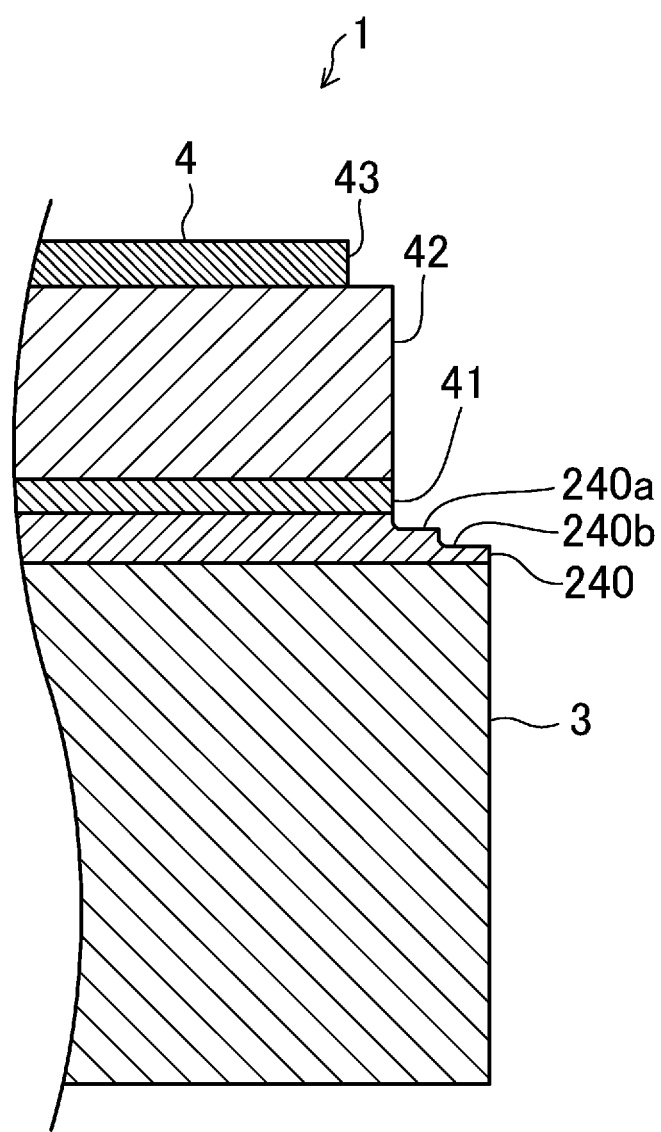
FIG. 13 is an enlarged cross-sectional view of the $SiO_2$ layer in the actuator.

In the actuator 1 of the mirror device 100 manufactured in the above manufacturing method, the $SiO_2$ layer 240 is formed so as to extend over the outside of the piezoelectric element 4. The extended part of the $SiO_2$ layer 240 includes steps. Specifically, as illustrated in FIG. 13, the outer peripheral edge portion of the $SiO_2$ layer 240 includes a first step 240a having a height lower than that of a portion of the $SiO_2$ layer 240 on which the piezoelectric element 4 is formed, and a second step 240b located outside the first step 240a and having a height lower than that of the first step.

The first step 240a is formed by slightly etching the $SiO_2$ layer 240 in the formation of the piezoelectric layer 42 and the lower electrode 41 by etching the PZT layer and the Pt/Ti layer in the piezoelectric element formation process.

The second step 240b is formed by slightly etching the extended part from the third resist mask 330 when the peripheral portion 255 is etched in the third etching process.

Advantages of Embodiment

Therefore, in the present embodiment, the method of manufacturing the mirror device 100 which includes the mirror 110 and the actuator 1 including the actuator body 3 on which the piezoelectric element 4 is formed, the actuator being configured to actuate the mirror 110, includes preparing the SOI substrate 200 on which the $SiO_2$ layer 240 is formed, the piezoelectric element 4 being formed on the portion of the $SiO_2$ layer 240 located on the actuator body portion 251, first removing the portion of the $SiO_2$ layer 240 located in the second region 200b including the mirror portion 252 by etching while leaving the $SiO_2$ layer 240 located in the first region 200a of the SOI substrate 200 including the actuator body portion 251, second removing at least the portion of the $SiO_2$ layer 240 located on the peripheral portion 255 of the actuator body portion 251 in the first region 200a of the SOI substrate 200 by etching, and third removing the peripheral portion 255 of the actuator body portion 251 and the peripheral portion 256 of the mirror portion 252 of the SOI substrate 200 by etching after forming the third resist mask 330 covering the actuator body portion 251 and the mirror portion 252 of the SOI substrate 200, wherein in the second removing, the $SiO_2$ layer 240 on the surface of the actuator body portion 251 is left so as to extend from the piezoelectric element 4, and the third resist mask 330 in the third removing includes the first slit 331 and the second slit 332, the second slit 332 exposing the peripheral portion 256 of the mirror portion 252 of the SOI substrate 200, and the first slit 331 exposing the peripheral portion 256 of the actuator body portion 251 of the SOI substrate 200 and the portion of the $SiO_2$ layer 240 located on the actuator body portion 251, and having a width wider than the second slit 332.

According to the above configuration, since the piezoelectric element 4 is formed on the actuator body portion 251, the height of the portion of the third resist mask 330 on the actuator body portion 251 from the SOI substrate 200 is higher than that of the portion of the third resist mask 330 on the mirror portion 252. Therefore, the first slit 331 formed in the portion of the third resist mask 330 formed on the actuator body portion 251 and its peripheral portion has a depth deeper than the second slit 332 formed in the portion of the third resist mask 330 formed on the mirror portion 252 and its peripheral portion.

According to the above configuration, the first slit 331 is formed to have a width wider than the second slit 332. This can allow the first slit 331 to pass through the third resist mask 330, and precisely form the second slit 332.

The first slit 331 is formed to have a wider width, whereby the portion of the third resist mask 330 formed on the actuator body portion 251 also exposes, as well as the peripheral portion 255, the part of the actuator body portion 251 (the outer peripheral edge portion of the actuator body portion 251). Thus, the portion of the third resist mask 330 formed on the actuator body portion 251 exposes a portion wider than a portion that will be removed. However, since the portion of the $SiO_2$ layer 240 located on the actuator body portion 251 is formed on the surface of the exposed portion, the $SiO_2$ layer 240 protects the exposed portion from being etched. Therefore, even the configuration of having the first slit 331 having a wider width can precisely form the actuator body portion 251. Since the second slit 332 has substantially the same width as the peripheral portion 256 of the mirror portion 252, the mirror portion 252 can be precisely formed.

The actuator body 3 is coupled to the mirror 110 through the first hinges 6, and the first hinges 6 are included in the second region 200b.

That is, since the first hinges 6 are included in the second region 200b, the third resist mask 330 formed on the first hinge portion 253 has a relatively small thickness. Therefore, if the conditions of photolithography are strong, the third resist mask 330 formed on the first hinge portion 253 may be excessively etched. The shape of the first hinge 6 significantly affects stiffness of the first hinge 6, and behavior of the mirror 110. That is, it is preferable that the first hinge 6 is precisely formed. the above manufacturing method can precisely form the third resist mask 330 formed on the first hinge portion 253 without using the strong conditions of photolithography. Therefore, the first hinge portion 253 can be precisely formed. As a result, the first hinge 6 can be precisely formed.

Furthermore, in the mirror device 100, the plurality of mirrors 110, 110, . . . are aligned in a predetermined array direction (main axis-X direction), the plurality of actuator bodies 3, 3, . . . are aligned in a direction parallel to the predetermined array direction, the first slit exposes, of the peripheral portion of the portions to be the actuator bodies, a region between adjacent ones of the portions to be the actuator bodies, and the second slit exposes, of the peripheral portion of the portions to be the mirrors, a region between adjacent ones of the portions to be the mirrors.

That is, in the mirror device 100 in which the plurality of mirrors 110, 110, . . . are aligned and the plurality of actuator bodies 3, 3, . . . are aligned, there is a gap between adjacent ones of the mirrors 110, 110 and between adjacent ones of the actuator bodies 3, 3. In order to form the gap by etching, the resist mask has to have a slit corresponding to the gap. In the above configuration, the first slit 331 is a slit to form a gap between adjacent ones of the actuator bodies 3, 3, and the second slit 332 is a slit to form a gap between adjacent ones of the mirrors 110, 110. In the mirror device 100 in which the mirrors 110, 110, . . . are aligned and the actuator bodies 3, 3, . . . are aligned, it is preferable that the interval between adjacent ones of the mirrors 110, 110 and the interval between adjacent ones of the actuator bodies 3, 3 are narrow to reduce the size of the mirror device 100. When the mirror device 100 is applied to the wavelength selection switch 108, the intervals between the mirrors 110, 110, . . . are preferably narrow to reduce optical loss. In such a case, the width of the first slit 331 and the width of the second slit 332 of the third resist mask 330 are narrow. If the width of the first slit 331 is narrow, it becomes more difficult to allow the third resist mask 330 to pass through the first slit 331 unless the conditions of photolithography are strong. If the width of the second slit 332 is narrow, it becomes more difficult to precisely form the second slit 332. In the mirror device 100 including the mirrors 110, 110, . . . and the actuator bodies 3, 3, . . . , the mirror device 100 cannot be used as a whole if even one of the mirrors 110 or one of the actuator bodies 3 cannot be appropriately formed. That is, accuracy in forming the mirror 110 and the actuator body 3 significantly affects a yield of the mirror device 100.

Therefore, the use of the above manufacturing method as a method of manufacturing the mirror device 100 can obtain advantages of being able to reduce the size of the mirror device 100, to reduce light loss, to improve the yield of the mirror device 100, etc.

The first slit 331 has a width wider than the interval between portions of the SiO$_2$ layer 240 respectively formed on adjacent ones of the actuator body portions 251, 251.

According to the above configuration, since the portion of the SiO$_2$ layer 240 is formed on the outer peripheral edge portion of the actuator body portion 251, a portion between adjacent ones of the portions of the SiO$_2$ layer 240 is the peripheral portion 255 of the actuator body portion 251 in a space between the adjacent ones of the actuator body portions 251, 251. That is, the first slit 331 has a width wider than that of the peripheral portion 255 between adjacent ones of the actuator body portions 251, 251. However, as described above, since the portion of the SiO$_2$ layer 240 is formed on the outer peripheral edge portion of the actuator body portion 251, the actuator body portion 251 is protected from being etched, and the peripheral portion 255 is etched.

The first slit 331 has a width wider than an interval between the adjacent ones of the mirror portions 252, 252.

According to the above configuration, the width of the first slit 331 is wider than that of the second slit 332. The second slit 332 has a width substantially the same as the interval between the adjacent ones of the mirror portions 252, 252. As a result, the width of the first slit 331 is wider than the interval between the adjacent ones of the mirror portions 252, 252. That is, the formation of the first slit 331 whose width is wider than the interval between the adjacent ones of the mirror portions 252, 252 makes it possible to precisely form the third resist mask 330 and precisely form the actuator body portion 251 and the mirror portion 252.

Furthermore, the first slit 331 has a depth deeper than the second slit 332.

In the first etching process, use of wet etching by HF for removing the SiO$_2$ layer 240 located in the second region 200b can reduce etching of the mirror portion 252, the first hinge portion 253, and the second hinge portion 254. The mirror surface layer 112 is formed on the surface of the mirror 110. The surface roughness of the mirror body 111 affects the reflectance of the mirror 110. That is, reduction of etching of the mirror portion 252 reduces the surface roughness of the mirror portion 252 to improve the reflectance of the mirror 110. The shapes of the first hinge 6 and the second hinge 7 affect stiffness of the first hinge 6 and the second hinge 7, and behavior of the mirror 110. That is, reduction of etching of the first hinge portion 253 and the second hinge portion 254 can lead to precise formation of the first hinge 6 and the second hinge 7.

In the second etching process, use of dry etching for removing the SiO$_2$ layer 240 of the peripheral portion 255 of the actuator body portion 251 can precisely process the peripheral portion 255. That is, the peripheral portion 255 has to be processed in a depth direction to have a predetermined width. Therefore, the use of anisotropic dry etching can precisely form the peripheral portion 255.

In this way, the removal of the portion of the SiO$_2$ layer 240 located in the second region 200b and the removal of the portion of the SiO$_2$ layer 240 located on the peripheral portion 255 of the actuator body portion 251 are independently performed in different processes, whereby each of the processes can use an appropriate etching method.

Furthermore, the portion of the SiO$_2$ layer 240 located in the second region 200b is removed prior to the removal of the portion of the SiO$_2$ layer 240 located on the peripheral portion 255 of the actuator body portion 251, thereby being able to prevent occurrence of an unexposed part of the first silicon layer 210. That is, since the portion of the SiO$_2$ layer 240 located in the second region 200b and the portion of the SiO$_2$ layer 240 located on the peripheral portion 255 are joined together, when the portions are independently etched in the different processes, there is a small region that is redundantly etched. However, when the portion of the SiO$_2$ layer 240 located on the peripheral portion 255 is etched first, and then, the portion of the SiO$_2$ layer 240 located in the second region 200b is etched, a substance is left on the redundantly etched region, thereby generating a portion where the first silicon layer 210 is not exposed. When the portion of the SiO$_2$ layer 240 located in the second region 200b is etched first, and then, the portion of the SiO$_2$ layer 240 located on the peripheral portion 255 is etched, the portion where the first silicon layer 210 is not etched can be prevented from being generated.

The masking in etching the portion of the SiO$_2$ layer 240 located on the peripheral portion 255 of the actuator body portion 251, and the masking in etching the first silicon layer 210, such as the peripheral portion 255 and the peripheral portion 256, are independently performed, thereby being able to precisely form the peripheral portion 255 and the peripheral portion 256. That is, if the same resist mask is used in etching the portion of the SiO$_2$ layer 240 located on the peripheral portion 255 and in etching the peripheral portion 255 and the peripheral portion 256, the etching of the SiO$_2$ layer 240 etches the resist mask, and the resist mask having a desired shape cannot be maintained in etching the peripheral portion 255, whereby the peripheral portion 255 and the peripheral portion 256 may not precisely have a desired shape. In contrast, different resist masks are independently formed, thereby being able to precisely form the peripheral portion 255 and the peripheral portion 256.

Second Embodiment

Figure 14:
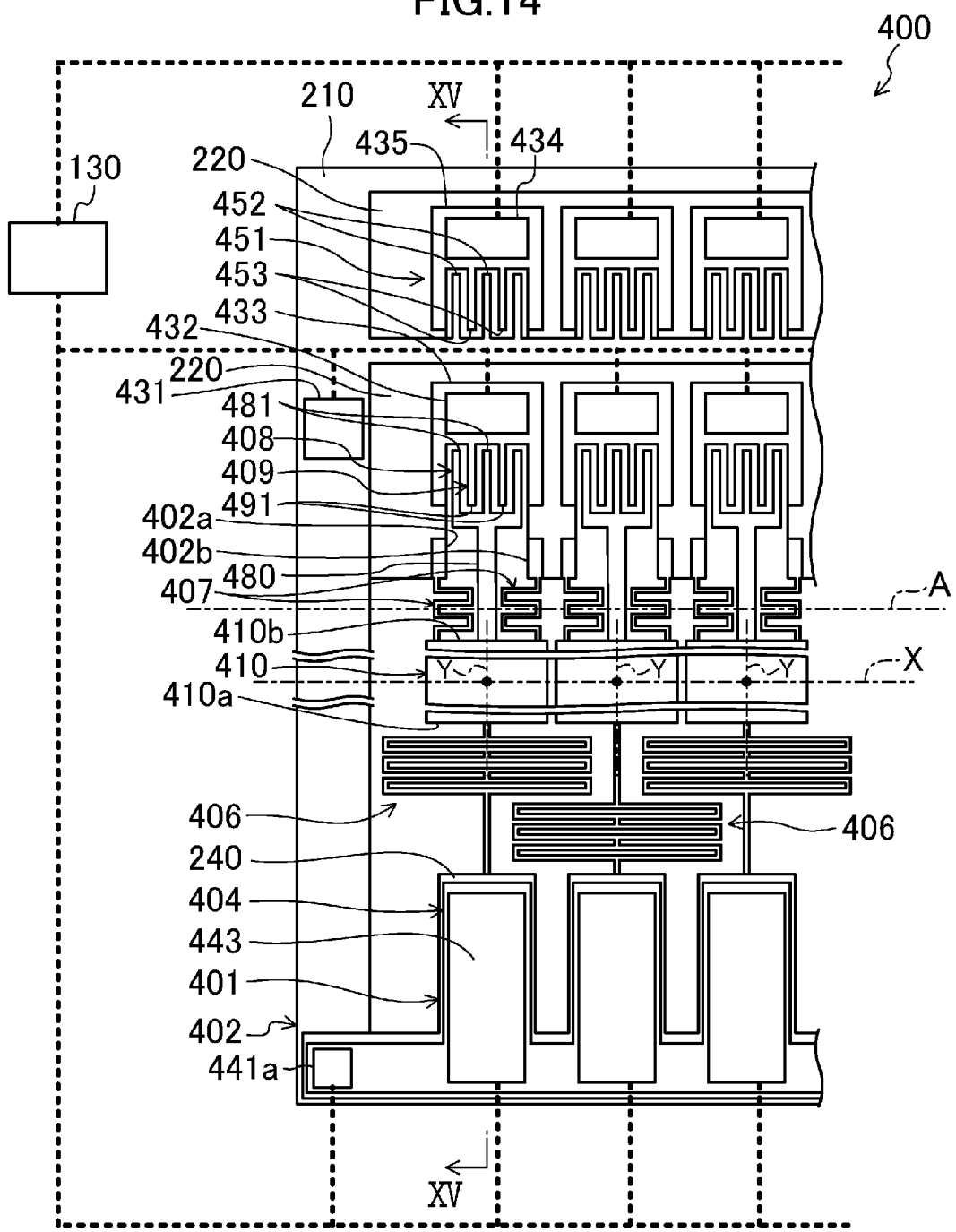
FIG. 14 is a plan view of a mirror device according to a second embodiment.
Figure 15:
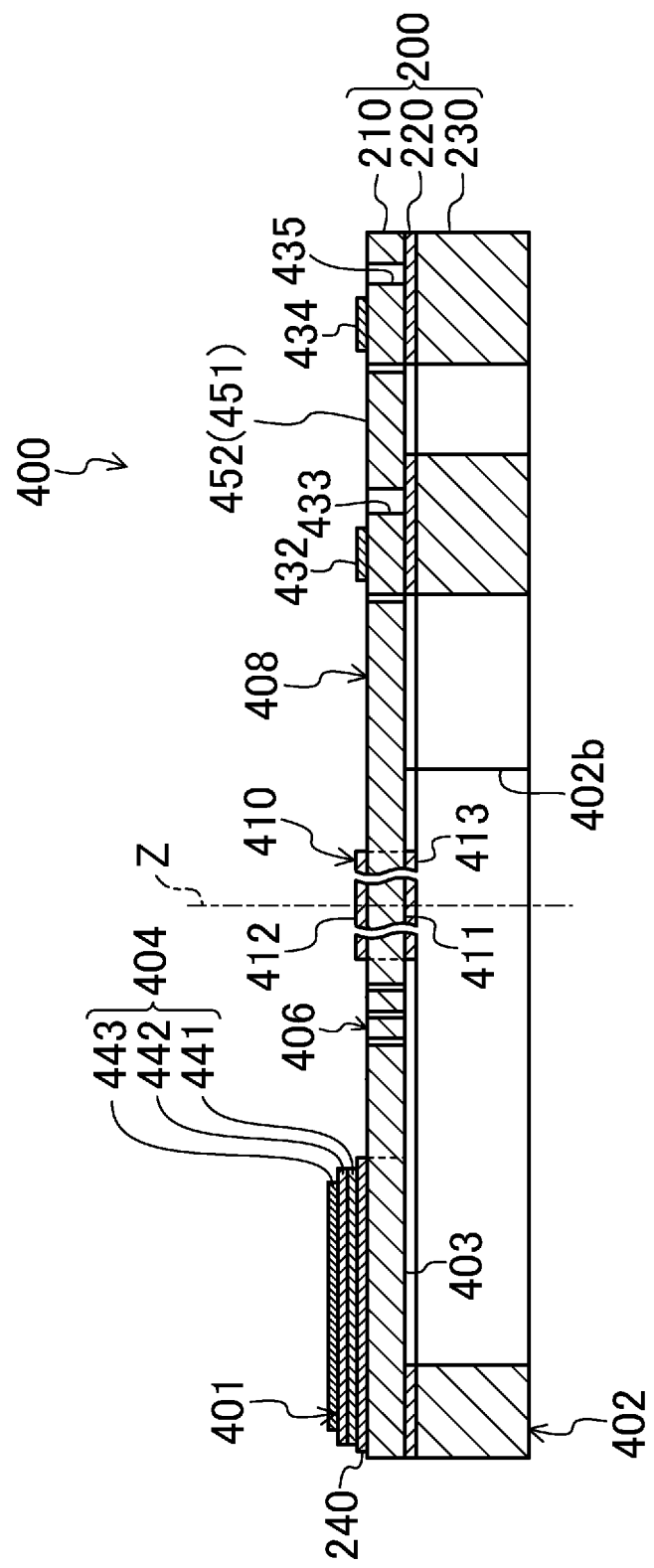
FIG. 15 is a cross-sectional view taken along the line XV-XV of FIG. 14.

Subsequently, the second embodiment will be described with reference to FIGS. 14 and 15. The second embodiment is different from the first embodiment in the configuration of a mirror device 400. FIG. 14 is a plan view of the mirror device 400. FIG. 15 is a cross-sectional view of the mirror device 400 taken along the line XV-XV of FIG. 1).

The mirror device 400 includes a plurality of mirror units. The plurality of mirror units are aligned in a predetermined X axis direction.

The mirror device 400 is manufactured using a SOI substrate 200 (see FIG. 15). The SOI substrate 200 is formed by sequentially stacking a first silicon layer 210 made of monocrystalline silicon, an oxide layer 220 made of $SiO_2$, and a second silicon layer 230 made of monocrystalline silicon.

The mirror device 400 includes a base 402 having a frame shape, a plurality of mirrors 410, 410, . . . , a plurality of actuators 401, 401, . . . actuating the mirrors 410, 410, . . . , a plurality of first hinges 406, 406, . . . each coupling each of the mirrors 410, 410, . . . to a corresponding one of the actuators 401, 401, . . . , second hinges 407, 407, . . . each coupling each of the mirrors 410, 410, . . . to the base 402, a plurality of movable comb electrodes 408 provided in the mirrors 410, 410, . . . , a plurality of fixed comb electrodes 409 provided in the base 402, a plurality of reference electrodes 451, and a controller 130. One of the mirrors 410 and one of the actuators 401, one of the movable comb electrodes 408, and one of the fixed comb electrodes 409 constitute one set of the mirror unit. One of the first hinges 406, and two of the second hinges 407, 407 are provided in each of the mirror units. One of the reference electrodes 451 is provided in each of the mirror units. Some of the mirror units share one controller 130. Each of the mirror units may be provided with one controller 130, or all the mirror units may share one controller 130.

Although not fully shown, the base 402 is formed to have a substantially rectangular frame shape. The base 402 is formed of the first silicon layer 210, the oxide layer 220, and the second silicon layer 230.

The mirror 410 is formed to have a substantially rectangular plate shape. The mirror 410 includes a mirror body 411 formed of the first silicon layer 210, and a mirror surface layer 412 formed on the front surface of the mirror body 411. The mirror surface layer 412 is made of an Au/Ti layer. A mirror surface layer 413, which is similar to the mirror surface layer 412, is formed on the back surface of the mirror body 411. The mirror surface layer 413 has a function of balancing a layer stress occurring in the front surface of the mirror body 411 due to the mirror surface layer 412. This can improve flatness of the mirror body 411, and the mirror surface layer 412.

Here, an axis passing through the middle point of the mirror 410, and extending in a direction in which the mirror 410 and the actuator 401 are aligned is referred to as a Y axis. The Y axis extends parallel to the longer side of the mirror 410. An axis passing through the middle point of the mirror 410 and extending parallel to the array direction of the mirrors 410, 410, . . . is referred to as an X axis. The X axis and the Y axis are orthogonal to each other. An axis orthogonal to both of the X axis and the Y axis is referred to as a Z axis. The Z axis direction may be referred to as a vertical direction. In this case, a side closer to the mirror surface layer 412 is the upper side, and a side closer to the mirror surface layer 413 is the lower side.

The actuator 401 extends from the base 402 in a cantilever fashion, and the tip end thereof is coupled to the mirror 410 through the first hinge 406. The actuator 401 curves to incline the mirror 410. Specifically, the actuator 401 includes an actuator body 403 having a base end coupled to the base 402, and overhanging from the base 402 in a cantilever fashion, and a piezoelectric element 404 formed on the surface of the actuator body 403.

The actuator body 403 is rectangular plate-shaped when viewed from the top. The actuator body 403 is formed of the first silicon layer 210. The actuator body 403 extends in the Y axis direction. The tip end of the actuator body 403 is coupled to a first short side 410a which is one shorter side of the mirror 410 through the first hinge 406.

The piezoelectric element 404 is formed on the front surface of the actuator body 403 (the same side on which the mirror surface layer 412 of the mirror 410 is formed). An $SiO_2$ layer 240 is formed on the surface of the actuator body 403, and the piezoelectric element 404 is formed on the $SiO_2$ layer 240. The basic configuration of the piezoelectric element 404 is the same as that of the piezoelectric element 4 in the first embodiment. That is, the piezoelectric element 404 includes a lower electrode 441, an upper electrode 443, and a piezoelectric layer 442 sandwiched therebetween. The lower electrode 441 is made of a Pt/Ti layer. The piezoelectric layer 442 is made of PZT. The upper electrode 443 is made of an Au/Ti layer. The $SiO_2$ layer 240 is formed to extend over the outside of the piezoelectric element 404.

The base 402 is provided with an actuating terminal 441a electrically connected to the lower electrode 441. A voltage is applied to the piezoelectric element 404 through the upper electrode 443 and the actuating terminal 441a.

In the actuator 401, when the voltage is applied to the piezoelectric element 404, the surface of the actuator body 403 on which the piezoelectric element 404 is formed contracts or expands to allow the actuator body 403 to curve in the vertical direction.

The first hinge 406 couples two members, i.e., the actuator 401 and the mirror 410 together, and is elastically-deformable. The first hinge 406 is formed of the first silicon layer 210. The first hinge 406 includes a plurality of annular portions aligned in the Y axis direction, and a coupling portion coupling the annular portions together. The annular portion is longer in the X axis direction than in the Y axis direction.

Specifically, the first hinge 406 includes two meandering portions which are parallelly aligned, and are symmetric about the Y axis. Proximity portions of the two meandering portions are coupled together. As a result, a plurality of annular portions are formed. Both ends of the two meandering portions are coupled to each other. In each of the meandering portions, three protrusions formed to have a protruding shape in a side away from the other meandering portion in the X axis direction, and two recesses formed to have a recessed shape in a side closer to the other meandering portion in the X axis direction are alternately aligned. The two recesses of one of the meandering portions and the two recesses of the other meandering portion are coupled together.

The second hinge 407 couples two members, i.e., the mirror 410 and the base 402 together, and is elastically-deformable. The mirror 410 is provided with two of the second hinges 407. The second hinge 407 has one end coupled to a second short side 410b of the mirror 410, and the other end coupled to the base 402. The second hinge 407 extends so as to meander between the mirror 410 and the base 402. The second hinge 407 is formed of the first silicon layer 210.

The movable comb electrode 408 is provided in the second short side 410b of the mirror 410 through the arm 480 in a cantilever fashion. The arm 480 extends between two of the second hinges 407 in the Y axis direction. The movable comb electrode 408 includes three electrode fingers 481, 481, . . . The electrode finger 481 is further from the mirror 410 than the second hinge 407 is. Three electrode fingers 481, 481, . . . extend in parallel to one another in the Y axis direction. The movable comb electrode 408 and the arm 480 are formed of the first silicon layer 210. The number of the electrode fingers 481 is not limited to the three.

The base 402 is provided with recesses 402a for allowing the movable comb electrodes 408 to enter therein. The fixed comb electrode 409 is provided in the recess 402a.

Each of the fixed comb electrodes 409 includes two electrode fingers 491, 491. The electrode fingers 491, 491 extend in parallel to each other in the Y axis direction. Each of the electrode fingers 491 enters a space between the electrode fingers 481 of the movable comb electrode 408. That is, the electrode finger 481 of the movable comb electrode 408 and the electrode finger 491 of the fixed comb electrode 409 face each other. The fixed comb electrode 409 is formed of the first silicon layer 210. The fixed comb electrode 409 is electrically insulated from the movable comb electrode 408. The number of electrode fingers 491 are not limited to the two.

The base 402 is provided with a first detection terminal 431 and a second detection terminal 432 which detect a capacitance between the movable comb electrode 408 and the fixed comb electrode 409.

The first detection terminal 431 is provided on the surface of a portion of the first silicon layer 210 of the base 402 electrically conducting to the movable comb electrode 408. The plurality of movable comb electrodes 408, 408, . . . share one first detection terminal 431. The first detection terminal 431 may be provided at each of the mirror units.

The second detection terminal 432 is provided on the surface of the electrode portion 433. The electrode portion 433 is formed of the first silicon layer 210 of the base 402, and is independent from the peripheral portion thereof on the oxide layer 220 of the base 402 to be electrically insulated. The fixed comb electrode 409 is coupled to the electrode portion 433. The second detection terminal 432 and the electrode portion 433 are provided in each of the fixed comb electrodes 409.

The base 402 is provided with reference electrodes 451. The reference electrode 451 includes first electrode fingers 452 corresponding to the electrode fingers 481 of the movable comb electrode 408, and second electrode fingers 453 corresponding to electrode fingers 491 of the fixed comb electrode 409. The first electrode fingers 452 and the second electrode fingers 453 have a configuration similar to that of the electrode fingers 481 and the electrode fingers 491. That is, three first electrode fingers 452 and two second electrode fingers 453 are provided. The second electrode finger 453 enters a space between the first electrode fingers 452. That is, the first electrode finger 452 and the second electrode finger 453 face each other.

The capacitance of the reference electrode 451 is detected through the first detection terminal 431 and the third detection terminal 434.

The first electrode finger 452 is electrically conducted to a portion of the first silicon layer 210 of the base 402, the portion including the first detection terminal 431.

A third detection terminal 434 is provided on the surface of an electrode portion 435. The electrode portion 435 has a configuration similar to that of the electrode portion 433. That is, the electrode portion 435 is formed of the first silicon layer 210 of the base 402, and is independent from the peripheral portion thereof on the oxide layer 220 of the base 402 to be electrically insulated. The second electrode finger 453 is coupled to the electrode portion 435.

A part of the oxide layer 220 and the second silicon layer 230 under the mirror 410, the actuator 401, the first hinge 406, the second hinge 407, the movable comb electrode 408, the fixed comb electrode 409, and the reference electrode 451 is removed.

A partition wall 402b is formed between adjacent ones of the fixed comb electrodes 409, 409. That is, adjacent ones of the recesses 402a, 402a are separated by the partition wall 402b. The partition wall 402b includes the first silicon layer 210, the oxide layer 220, and the second silicon layer 230.

Operation of Mirror Device

Subsequently, the operation of the mirror device 400 having such a configuration will be described.

Since the piezoelectric element 404 is formed on the actuator body 403, a warpage (hereinafter referred to as "initial warpage") may occur in the actuator 401 in a state where no voltage is applied to the piezoelectric element 404. The mirror 410 is inclined due to the initial curve. The initial curve varies in the respective actuators 401. Therefore, the respective mirrors 410 are inclined at different angles.

In order to operate the mirror device 400, a bias voltage is first applied to the piezoelectric element 404 to adjust the initial curve. This makes the inclination uniform among the mirrors 410, 410, . . . Specifically, the controller 130 applies a bias voltage to the upper electrode 443 and the lower electrode 441. If the polarity of the bias voltage is the same as that of a voltage in a poling process, the piezoelectric layer 442 contracts according to the bias voltage. This allows the surface of the piezoelectric element 404 closer to the actuator body 403 to contract. As a result, the curve state of the actuator body 403 is changed.

If the curve state of the actuator body 403 is changed, the tip end of the actuator body 403 is displaced. This allows the first short side 410a of the mirror 410 to be displaced in a similar manner. Since the second short side 410b of the mirror 410 is coupled to the base 402 through the second hinges 407, the second short side 410b is hardly displaced. As a result, the mirror 410 is inclined using the second hinge 407 as a supporting point to displace the side of the first short side 410a.

The inclination of the mirror 410 allows the movable comb electrode 408 to be inclined. The controller 130 adjusts the bias voltage based on the capacitance between the movable comb electrode 408 and the fixed comb electrode 409, which will be specifically described later, to make the inclination uniform among the mirrors 410, 410, . . .

In this way, in the initial state, the bias voltage is applied to the piezoelectric element 404, and the inclination is adjusted and is made uniform among the mirrors 410, 410, . . .

From this state, the controller 130 applies an actuating voltage to a desired mirror device 100 to individually control the mirrors 410. The mirror 410 is inclined according to the actuating voltage, similarly to when the bias voltage is applied. That is, the mirror 410 is inclined about an A axis that is parallel to the X axis and substantially passes through the second hinge 407. At this time, the first hinge 406 curves so as to protrude, and the second hinge 407 curves so as to be recessed.

Detection of Amount of Inclination of Mirror

When actuation of the actuator 401 allows the mirror 410 to be inclined, the movable comb electrode 408 is also inclined along with the inclination. Since the movable comb electrode 408 is located opposite to the mirror 410 with the second hinge 407 interposed therebetween when, for example, the mirror 410 is inclined so as to lift up the first short side 410a, the movable comb electrode 408 is inclined so as to lift down the electrode finger 481. This varies the area where the electrode fingers 481 of the movable comb electrode 408 and the electrode fingers 491 of the fixed comb electrode 409 face one another to vary the capacitance between the movable comb electrode 408 and the fixed comb electrode 409.

The controller 130 detects the capacitance between the movable comb electrode 408 and the fixed comb electrode 409 through the first detection terminal 431 and the second detection terminal 432. The controller 130 adjusts the voltage applied to the piezoelectric element 404 based on the variation of the capacitance to control the amount of inclination of the mirror 410.

At this time, the controller 130 also detects the capacitance of the reference electrode 451 through the first detection terminal 431 and the third detection terminal 434. Referring to the capacitance of the reference electrode 451, the controller 130 can more accurately obtain variation of the capacitance between the movable comb electrode 408 and the fixed comb electrode 409.

In such a configuration, if the mirrors 410 have the same inclination angle from a horizontal plane (for example, the surface of the base 402), the same detection result of the capacitance is obtained regardless of whether the mirror 410 is inclined downwardly or upwardly. Therefore, in the operation of the above-described mirror device 400, the bias voltage and the actuating voltage are set such that the mirror 410 is not inclined across the horizontal plane when the mirror 410 is actuated. That is, there are operations (i) where the actuator 401 curves upward so as to be over the horizontal plane due to the initial curve, and curves more upward by the bias voltage and curves still more upward by the actuating voltage, (ii) where the actuator 401 curves downward so as to be under the horizontal plane due to the initial curve, and curves upward by the bias voltage so as to be over the horizontal plane and curves more upward by the actuating voltage, and (iii) where the actuator 401 curves downward so as to be under the horizontal plane due to the initial curve, and curves upward by the bias voltage within a range where the actuator 401 is under the horizontal plane and curves more upward by the actuating voltage within the range where the actuator 401 is under the horizontal plane (that is, the actuator 401 does not curve upward so as to be over the horizontal plane). Such operations of the actuator 401 are examples.

Method of Manufacturing Mirror Device

The mirror device 400 having the above-described configuration different from the configuration of the mirror device 1 in the first embodiment can be manufactured by a manufacturing method similar to that in the first embodiment. That is, the mirror device 400 is manufactured by etching the SOI substrate 200 and forming the layers on the surface. At that time, performing the preparation process, the first removal process, the second removal process, and the third removal process can precisely form a portion to be the actuator body 403 and a portion to be the mirror 410.

Other Embodiments

The above embodiments may have the following configuration.

In the above embodiments, the SOI substrate 200 is described as one example of the substrate, and the SiO$_2$ layer 240 is described as one example of the insulation layer, but the substrate and the insulation layer are not limited thereto. Examples of the substrate include a conductor substrate (including a semiconductor substrate), and an insulator substrate. Examples of the conductor substrate include a monocrystalline silicon substrate, a polycrystalline silicon substrate, and an SiC substrate, etc. Examples of the insulator substrate include an SiO$_2$ substrate (for example, a glass substrate), etc. Examples of the insulation layer include an oxide layer, etc.

The numbers of the actuators 1, the mirrors 110, the beam members 120, the first hinges 6 and the second hinges 7 in the mirror device 100 are one examples, and are not limited to these in the above embodiments. One actuator 1 and one mirror 110 may be provided.

The configuration of one set of the mirror units is not limited to that in the above embodiments. For example, the mirror 110 is supported by the actuators 1 and the beam member 120, but may be supported by only the actuators 1. That is, the mirror 110 may be supported such that one edge thereof is supported by the actuators 1 and the other edge thereof is supported by the base 2. Furthermore, another actuator may be provided instead of the beam member 120. That is, the mirror 110 may be supported by the actuators from both edges. The two actuators 1, 1 are provided to one mirror 110, but the number of the actuators 1 is not limited thereto. For example, one actuator 1 is provided to one mirror 110. Furthermore, the shapes and the numbers of the first hinges 6 and the second hinges 7 may be changed, or these hinges may be omitted.

In the above embodiments, no counter electrode is provided to face the actuator body 3 with a gap therebetween, but such a counter electrode may be provided. Detection of a capacitance between the counter electrode and the actuator body 3 can estimate the curve degree of the actuator body 3.

The above manufacturing method specifies the dry etching, the wet etching, the thermal oxidation, etc., but the method is not limited thereto. That is, as long as the actuator can be manufactured, the etching method is not especially limited, and the layer formation method is not limited. For example, reduction pressure chemical vapor deposition (CVD), plasma CVD or sputtering may be performed instead of the thermal oxidation.

In the above embodiments, the resist mask is made of a positive resist, but may be made of a negative resist.

The materials and shapes described in the above embodiments are merely one example, and are not limited thereto. For example, the lower electrode 41 may be an Ir/TiW layer, and the upper electrode 43 may be an Au/Pt/Ti layer.

The embodiments are described above as examples of the technique of the present disclosure. The attached drawings and the above detailed description are provided in order to describe these embodiments.

Accordingly, not only the components that are essential for solving the problem but also the components that are not essential for solving the problem may be included in the components shown in the attached drawings and the detailed description. Even if those non-essential components are shown in the drawings or the detailed description, these components should not be construed as essential components.

The above embodiments are shown by way of example in order to describe the technique of the present disclosure, and therefore various modifications, replacements, additions, omissions, etc. can be made without departing from the scope of the claims.

INDUSTRIAL APPLICABILITY

As described above, the technique disclosed herein is useful for a method of manufacturing a mirror device.

DESCRIPTION OF REFERENCE CHARACTERS 100, 400 mirror device
110, 410 mirror
200 SOI substrate (substrate)
200a first region
200b second region
210 first silicon layer
240 SiO$_2$ layer (insulation layer)
251 actuator body portion
252 mirror portion 255 peripheral portion
256 peripheral portion
330 third resist mask
331 first slit
332 second slit
1, 401 actuator
3, 403 actuator body
4, 404 piezoelectric element
6, 406 first hinge
7, 407 second hinge

The invention claimed is:

1. A method of manufacturing a mirror device which includes at least one mirror and an actuator including at least one actuator body on which a piezoelectric element is formed, the actuator being configured to actuate the at least one mirror, the method comprising:
preparing a substrate on which an insulation layer is formed, the piezoelectric element being formed on a portion of the insulation layer located on at least one portion to be the actuator body;
first removing a portion of the insulation layer located in a second region including at least one portion to be the mirror by etching while leaving the insulation layer located in a first region of the substrate including the at least one portion to be the actuator body;
second removing at least a portion of the insulation layer located on a peripheral portion of the portion to be the actuator body in the first region of the substrate by etching; and
third removing the peripheral portion of the portion to be the actuator body and a peripheral portion of the portion to be the mirror of the substrate by etching after forming a resist mask covering the at least one portion to be the actuator body and the at least one portion to be the mirror of the substrate, wherein
in the second removing, the insulation layer on a surface of the portion to be the actuator body is left so as to expand from the piezoelectric element, and
the resist mask in the third removing includes a first slit and a second slit, the second slit exposing the peripheral portion of the portion to be the mirror of the substrate, and the first slit exposing the peripheral portion of the portion to be the actuator body of the substrate and the portion of the insulation layer located on the portion to be the actuator body, and having a width wider than the second slit.

2. The method of claim 1, wherein
the at least one actuator body is coupled to the at least one mirror through a hinge, and
the hinge is included in the second region.

3. The method of claim 1, wherein
in the mirror device,
the at least one mirror includes a plurality of mirrors aligned in a predetermined array direction,
the at least one actuator body includes a plurality of actuator bodies aligned in a direction parallel to the predetermined array direction,
the at least one portion to be the actuator body includes a plurality of portions to be a plurality of actuator bodies,
the at least one portion to be the mirror includes a plurality of portions to be a plurality of mirrors,
the first slit exposes, of a peripheral portion of the portions to be the actuator bodies, a region between adjacent ones of the portions to be the actuator bodies, and
the second slit exposes, of a peripheral portion of the portions to be the mirrors, a region between adjacent ones of the portions to be the mirrors.

4. The method of claim 3, wherein
the first slit has a width wider than an interval between portions of the insulation layer respectively located on adjacent ones of the portions to be the actuator bodies.

5. The method of claim 3, wherein
the first slit has a width wider than an interval between the adjacent ones of the portions to be the mirrors.

6. The method of claim 3, wherein
the first slit has a depth deeper than the second slit.

* * * * *